(12) United States Patent
Wu et al.

(10) Patent No.: US 12,334,388 B2
(45) Date of Patent: Jun. 17, 2025

(54) ISOLATION STRUCTURE AND A SELF-ALIGNED CAPPING LAYER FORMED THEREON

(71) Applicant: Taiwan Semiconductor Manufacturing Company, Ltd., Hsin-Chu (TW)

(72) Inventors: I-Wen Wu, Hsinchu (TW); Po-Yu Huang, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 17/748,632

(22) Filed: May 19, 2022

(65) Prior Publication Data

US 2023/0377943 A1 Nov. 23, 2023

(51) Int. Cl.
*H01L 21/762* (2006.01)
*H01L 21/28* (2025.01)
(Continued)

(52) U.S. Cl.
CPC ..... *H01L 21/76224* (2013.01); *H10D 30/031* (2025.01); *H10D 84/83* (2025.01);
(Continued)

(58) Field of Classification Search
CPC ............ H01L 21/76224; H01L 27/088; H01L 29/66742; H01L 21/28247; H01L 29/42392; H01L 29/66545; H01L 29/0673; H01L 29/66439; H01L 21/76834; H01L 21/76897; H01L 21/823475; H01L 21/823481; H01L 29/665; H01L 29/6656;
(Continued)

(56) References Cited

U.S. PATENT DOCUMENTS 10,770,589 B2 * 9/2020 Cheng ............... H01L 29/66795
2014/0042518 A1 2/2014 Shim
(Continued)

FOREIGN PATENT DOCUMENTS

TW 202201635 A 1/2022

*Primary Examiner* — Allison Bernstein
(74) *Attorney, Agent, or Firm* — HAYNES AND BOONE, LLP

(57) ABSTRACT

Semiconductor structures and methods are provided. An exemplary method according to the present disclosure includes providing a workpiece including a semiconductor fin protruding from a substrate, a first placeholder gate and a second placeholder gate over channel regions of the semiconductor fin, and a source/drain feature disposed between the channel regions. The method also includes removing a portion of the first placeholder gate and a portion of the substrate directly disposed thereunder to form an isolation trench, forming a dielectric feature in the isolation trench, replacing the second placeholder gate with a metal gate stack, selectively recessing the dielectric feature, forming a first capping layer over the metal gate stack and a second capping layer over the recessed dielectric feature, and forming a source/drain contact over and electrically coupled to the source/drain feature.

20 Claims, 21 Drawing Sheets

(51) Int. Cl.
*H10D 30/01* (2025.01)
*H10D 30/67* (2025.01)
*H10D 64/01* (2025.01)
*H10D 84/83* (2025.01)

(52) U.S. Cl.
CPC .... *H01L 21/28247* (2013.01); *H10D 30/6735* (2025.01); *H10D 64/017* (2025.01)

(58) Field of Classification Search
CPC ............ H01L 29/78696; H01L 29/165; H01L 29/6653; H01L 29/7848; H01L 29/775; B82Y 10/00; H10D 30/031; H10D 84/83; H10D 30/6735; H10D 64/017; H10D 30/0212; H10D 30/6757; H10D 30/014; H10D 30/43; H10D 30/797; H10D 64/021; H10D 84/0149; H10D 62/121; H10D 62/822; H10D 64/015; H10D 84/0151; H10D 84/038
See application file for complete search history.

(56) References Cited

U.S. PATENT DOCUMENTS

| | | | |
|---|---|---|---|
| 2018/0358450 A1* | 12/2018 | Kim | ............... H01L 27/0886 |
| 2020/0105607 A1 | 4/2020 | Zhang | |
| 2020/0152736 A1 | 5/2020 | Yu | |
| 2020/0381426 A1 | 12/2020 | Xu | |
| 2021/0020521 A1 | 1/2021 | Zhu | |
| 2021/0343597 A1* | 11/2021 | Ko | ............... H01L 21/823418 |

\* cited by examiner

ISOLATION STRUCTURE AND A SELF-ALIGNED CAPPING LAYER FORMED THEREON

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Such scaling down has also increased the complexity of processing and manufacturing ICs and, for these advances to be realized, similar developments in IC processing and manufacturing are needed. For example, various methods have been developed to form isolation structures to divide active regions into segments. While existing isolation structures are generally adequate in isolating active region segments, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
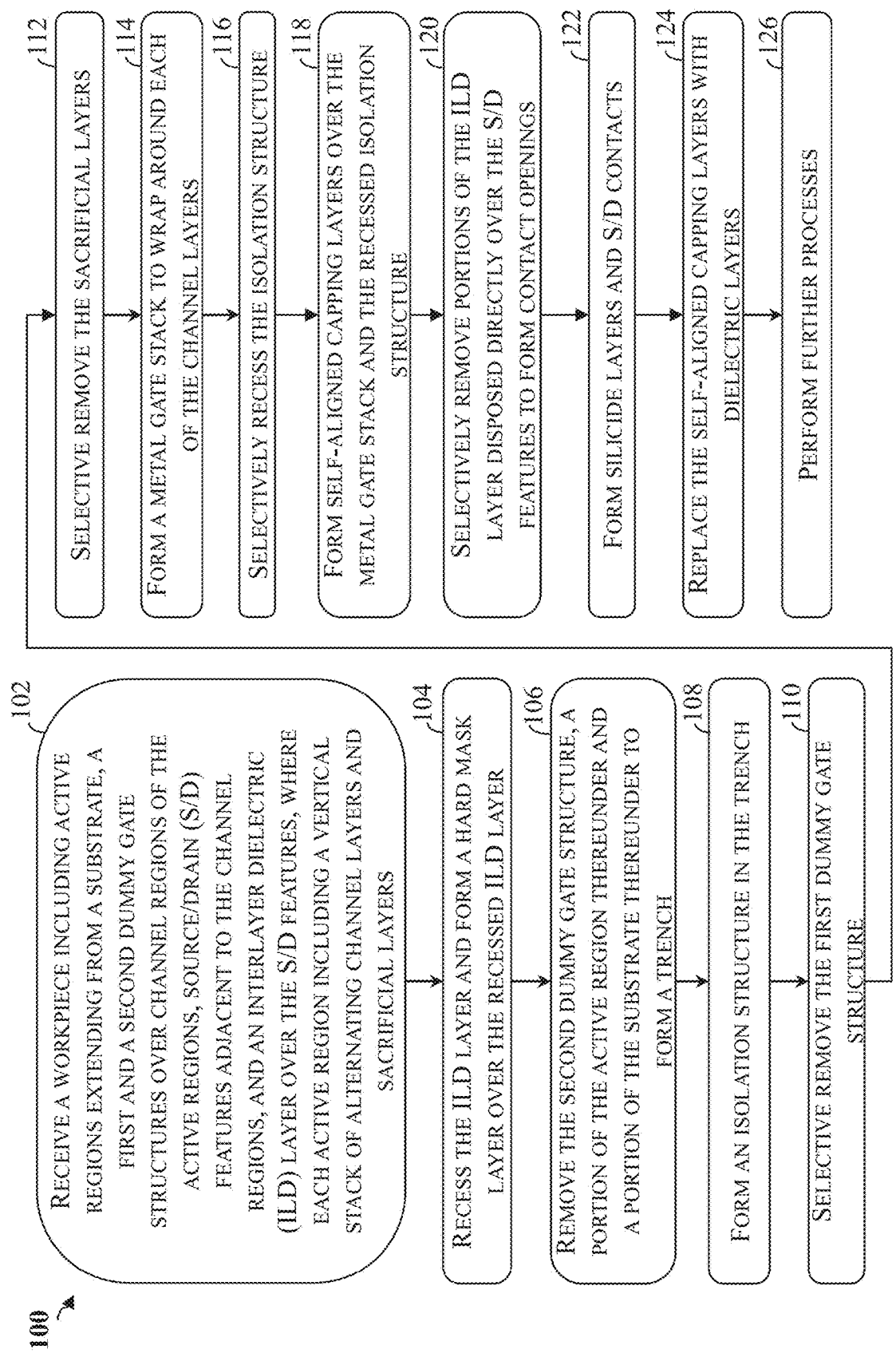
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

Continuous poly on diffusion edge (CPODE) processes have been developed to form isolation structures (may be referred to as CPODE structures or dielectric gates) to divide active regions into segments. CPODE structures and other similar structures are a scaling tool to improve density of devices (e.g., transistors). To achieve desired scaling effect while maintaining the devices' proper functions (e.g., avoiding electrical shorting), the CPODE structures may be formed between boundaries of such devices (i.e., between, for example, source/drain (S/D) contacts formed subsequently over the epitaxial S/D features), such that the separation distance between adjacent devices may be reduced or minimized without compromising device performance. However, after forming the CPODE structures, subsequent processes (e.g., processes for forming source/drain contact openings) may damage the CPODE structures, resulting in a height reduced CPODE structure. As a result, two adjacent source/drain contacts may merge, leading to unintentional electrical shorting.

The present embodiments are directed to methods of forming a self-aligned capping layer over the CPODE structure to protect the CPODE structure during the formation of source/drain contact openings. In some embodiments, an exemplary method includes providing a workpiece including a semiconductor fin protruding from a substrate, a first placeholder gate and a second placeholder gate over channel regions of the semiconductor fin, and a source/drain feature disposed between the channel regions. The method also includes removing a portion of the first placeholder gate and a portion of the substrate directly disposed thereunder to form an isolation trench, forming a CPODE structure in the isolation trench, replacing the second placeholder gate with a metal gate stack, selectively recessing the CPODE structure, forming a first capping layer over the metal gate stack and a second capping layer over the recessed CPODE structure, and forming a source/drain contact over and electrically coupled to the source/drain feature. By providing the CPODE structure with the capping layer, a combination of the CPODE structure and the capping layer isolates two adjacent source/drain contacts, preventing unintentional electrical shorting therebetween.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2-21, which are fragmentary cross-sectional views or top views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method 100. Not all steps are described herein in detail for reasons of simplicity. Because the workpiece 200 will be fabricated into a semiconductor structure 200 upon conclusion of the fabrication processes, the workpiece 200 may be referred to as the semiconductor structure 200 as the context requires. For avoidance of doubts, the X, Y and Z directions in the figures are perpendicular to one another and are used consistently. Throughout the present disclosure, like reference numerals denote like features unless otherwise excepted.

Figure 2:
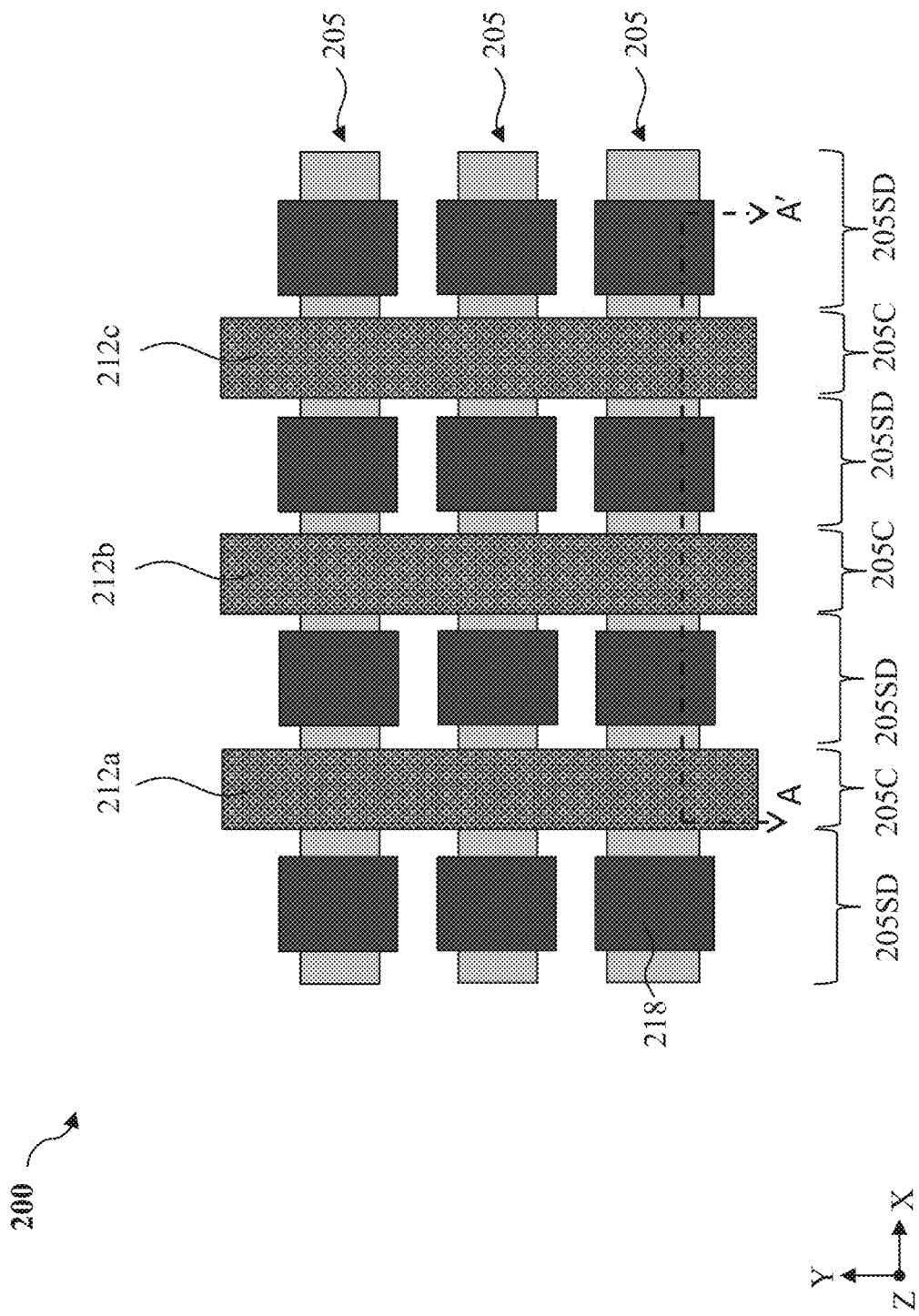
FIG. 2 illustrates a fragmentary top view of an exemplary workpiece to undergo various stages of operations in the methods of FIG. 1, according to various aspects of the disclosure.
Figure 3:
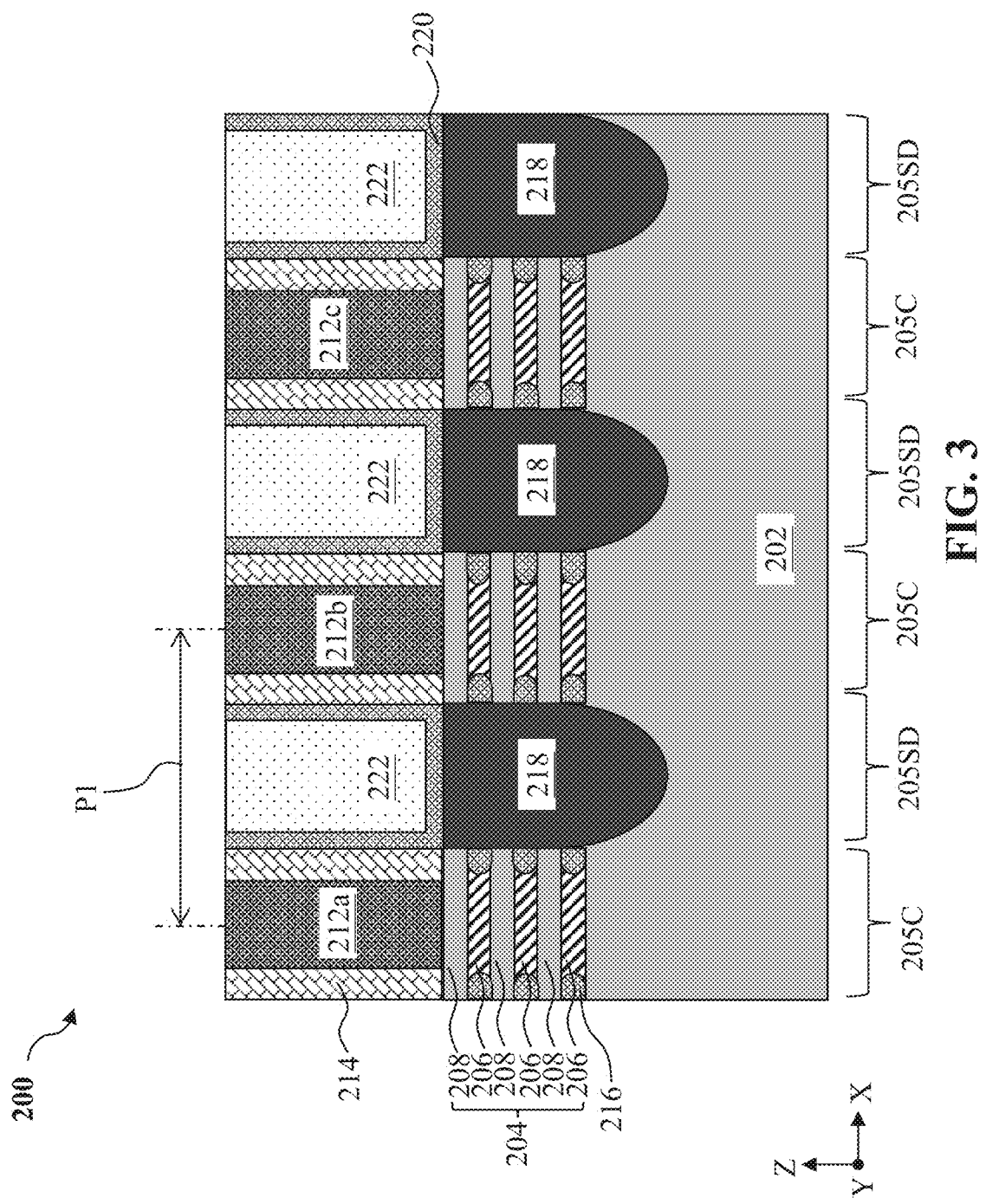
FIGS. 3, 4, 5, 6, 7, 8, 9, 11, 12, 13, 14, 15, 16, 17, 18, 19, 20, and 21 illustrate fragmentary cross-sectional views of the workpiece taken along line A-A' as shown in FIG. 2 during a fabrication process according to the method of FIG. 1, according to various aspects of the disclosure.

Referring to FIGS. 1, 2 and 3, method 100 includes a block 102 where a workpiece 200 is received. The workpiece 200 includes a substrate 202 (shown in FIG. 3). In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator substrate, or a germanium-on-insulator substrate, and includes a carrier, an insulator on the carrier, and a semiconductor layer on the insulator.

The workpiece 200 also includes multiple fin-shaped active regions 205 disposed over the substrate 202. Each of the fin-shaped active regions 205 extends lengthwise along the X direction and is divided into channel regions 205C and source/drain regions 205SD. Source/drain region(s) may refer to a source or a drain, individually or collectively dependent upon the context. The fin-shaped active regions 205 may be formed from a portion of the substrate 202 and a vertical stack 204 (shown in FIG. 3) of alternating semiconductor layers 206 and 208 using a combination of lithography and etch steps. In the depicted embodiment, the vertical stack 204 of alternating semiconductor layers 206 and 208 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In some examples, each of the fin-shaped active regions 205 may include a total of three to ten pairs of alternating sacrificial layers 206 and channel layers 208; of course, other configurations may also be applicable depending upon specific design requirements. In alternative embodiments where fin-type field effect transistors (FinFETs) are desired, the fin-shaped active regions 205 may include a uniform semiconductor composition along the Z axis and free of the vertical stack 204 as depicted herein.

The workpiece 200 may also include an isolation feature (not shown) formed around the fin-shaped active regions 205 to isolate two adjacent fin-shaped active regions. The isolation feature may also be referred to as a shallow trench isolation (STI) feature. In some embodiments, the STI feature may include silicon oxide, silicon oxynitride, fluorine-doped silicate glass (FSG), a low-k dielectric, combinations thereof, and/or other suitable materials.

Still referring to FIGS. 2 and 3, the workpiece 200 also includes dummy gate structures such as dummy gate structures 212a-212c disposed over channel regions 205C of the fin-shaped active regions 205. In some embodiments, the dummy gate structures 212a-212c may share substantially the same composition and dimension. The channel regions 205C and the dummy gate structures 212a-212c also define source/drain regions 205SD that are not vertically overlapped by the dummy gate structures 212a-212c. Each of the channel regions 205C is disposed between two source/drain regions 205SD along the X direction. Three dummy gate structures are shown in FIGS. 2 and 3 but the workpiece 200 may include other numbers of dummy gate structures. In this embodiment, a gate replacement process (or gate-last process) is adopted where some of the dummy gate structures 212a-212c serve as placeholders for functional gate stacks and/or CPODE structures. Other processes for forming the functional gate stacks are possible. In the present embodiments, although not separately shown, each of the dummy gate structures (e.g., dummy gate structure 212a-212c) includes a dummy gate dielectric layer (e.g., silicon oxide) and a dummy gate electrode (e.g., polysilicon) disposed over the dummy gate dielectric layer. As discussed in detail below, at least portions of the dummy gate structures 212a-212c are configured to be replaced with a respective functional gate stack 242 (shown in FIG. 14), while at least a portion of the dummy gate structure 212b would be replaced with a CPODE structure 235 (shown in FIG. 13) to provide an isolation between neighboring active regions. The workpiece 200 has a gate pitch P1.

Still referring to FIG. 3, the workpiece 200 also includes gate spacers 214 extending along sidewalls of the dummy gate structures 212a-212c. In some embodiments, the gate spacers 214 may include silicon oxide, silicon oxycarbide, silicon carbonitride, silicon oxycarbonitride, silicon nitride, zirconium oxide, aluminum oxide, or a suitable dielectric material. The gate spacers 214 may be a single-layer structure or a multi-layer structure. Additionally, the workpiece 200 also includes inner spacer features 216 disposed between two adjacent channel layers 208 and in direct contact with the sacrificial layers 206 in the channel regions 205C. The inner spacer features 216 may include silicon nitride, silicon oxycarbonitride, silicon carbonitride, silicon oxide, silicon oxycarbide, silicon carbide, silico oxynitride, other suitable materials, or combinations thereof.

In embodiments represented in FIGS. 2 and 3, the workpiece 200 also includes source/drain features 218 formed in and/or over source/drain regions 205SD and coupled to the channel layers 208 in the channel regions 205C. Depending on the conductivity type of the to-be-formed transistor, the source/drain features 218 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIG. 3, the workpiece 200 also includes a contact etch stop layer (CESL) 220 and an interlayer dielectric (ILD) layer 222. The CESL 220 is configured to protect the various underlying components during subsequent fabrication processes and may include silicon nitride, silicon oxynitride, and/or other suitable materials and may be formed by ALD, chemical vapor deposition (CVD), plasma-enhanced chemical vapor deposition (PECVD) process and/or other suitable deposition or oxidation processes. As shown in FIG. 3, the CESL 220 may be formed on top surfaces of the source/drain features 218 and sidewalls of the gate spacers 214. The ILD layer 222 is deposited by a CVD process, a PECVD process or other suitable deposition technique over the workpiece 200 after the deposition of the CESL 220. The ILD layer 222 may include silicon oxide, a low-k dielectric material, TEOS, doped silicon oxide (e.g., BPSG, FSG, PSG, BSG, etc.), other suitable dielectric materials, or combinations thereof. One or more chemical mechanical planarization (CMP) processes may be performed to planarize the top surface of the workpiece 200 after the deposition of the CESL 220 and the ILD layer 222. It is noted that, features such as CESL 220, ILD layer, gate spacers 214 and other features are omitted in the top view of the workpiece 200 shown in FIG. 2 for reason of simplicity.

Figure 4:
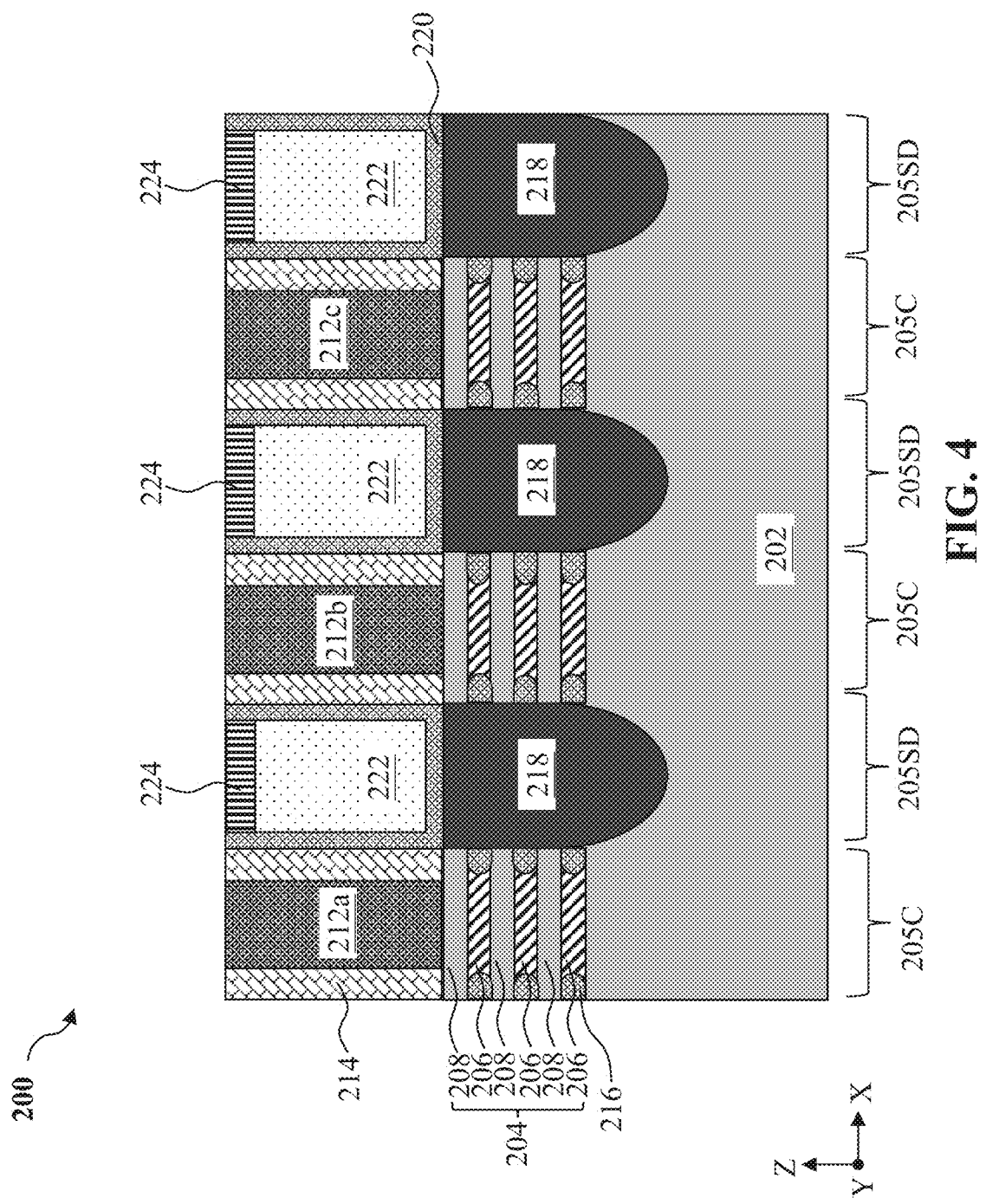
Figure 5:
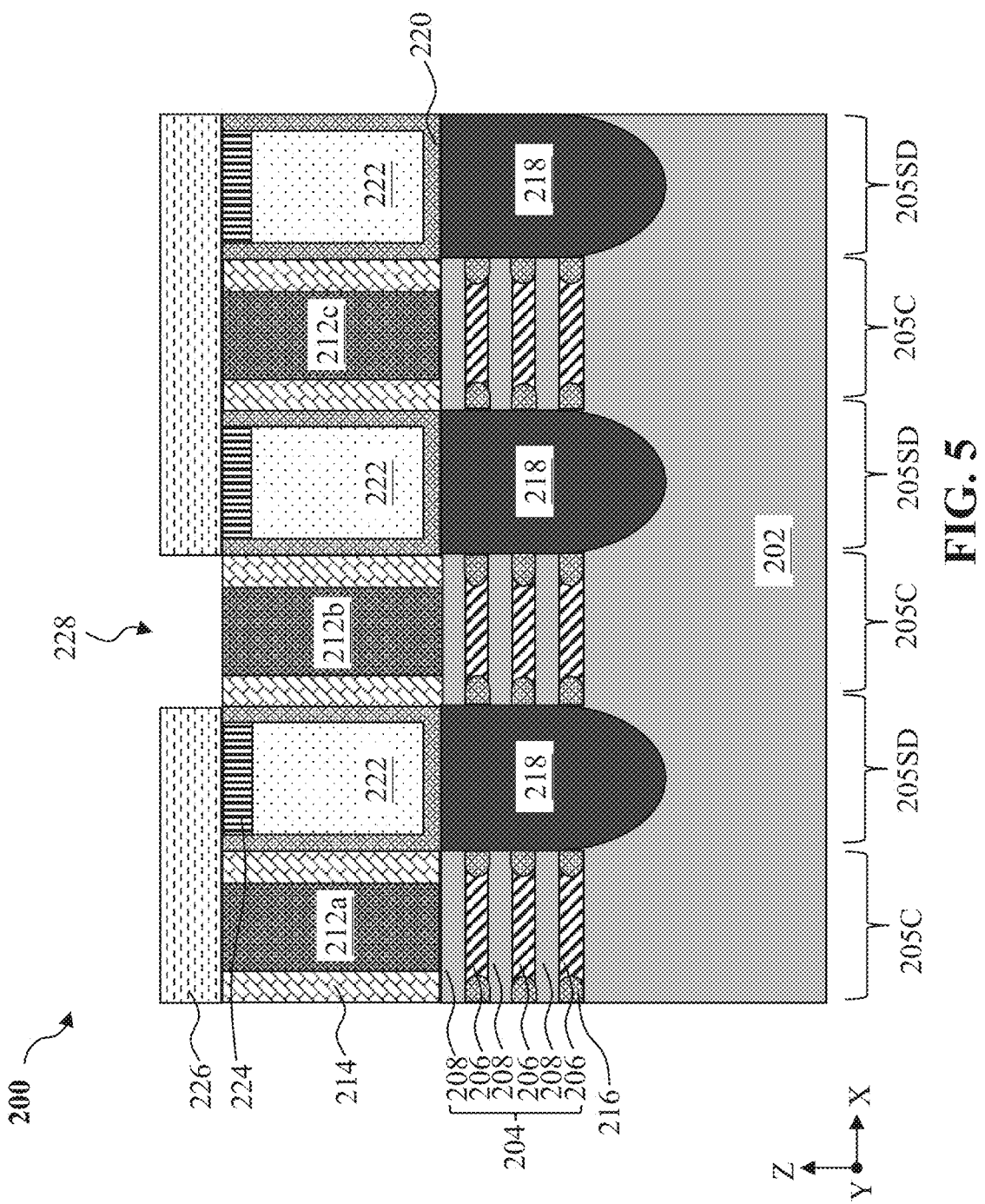

Now referring to FIGS. 1 and 4, method 100 includes a block 104 where the ILD layer 222 is recessed and a hard mask layer 224 is formed over the recessed ILD layer 222. An etching process may be performed to selectively remove a top portion of the ILD layer 222 without removing, or substantially removing, the dummy gate structures 212a-212c, the CESL 220, or the gate spacers 214 to form trenches between two adjacent dummy gate structures. The etching process may be a dry etching process, a wet etching process, an RIE process, other suitable processes, or combinations thereof. A hard mask layer 224 may be then deposited over the workpiece 200 to fill the trenches between two adjacent dummy gate structures. The hard mask layer 224 may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In the present embodiments, the hard mask layer 224 includes SiN and is deposited by an ALD process. Subsequently, a planarization process (e.g., one or more CMP processes) may be followed to remove excess portions of the hard mask layer 224 formed over top surfaces of the dummy gate structures 212a-212c. That is, after the CMP processes, a top surface of the hard mask layer 224 is coplanar with top surfaces of the dummy gate structures 212a-212c.

Figure 6:
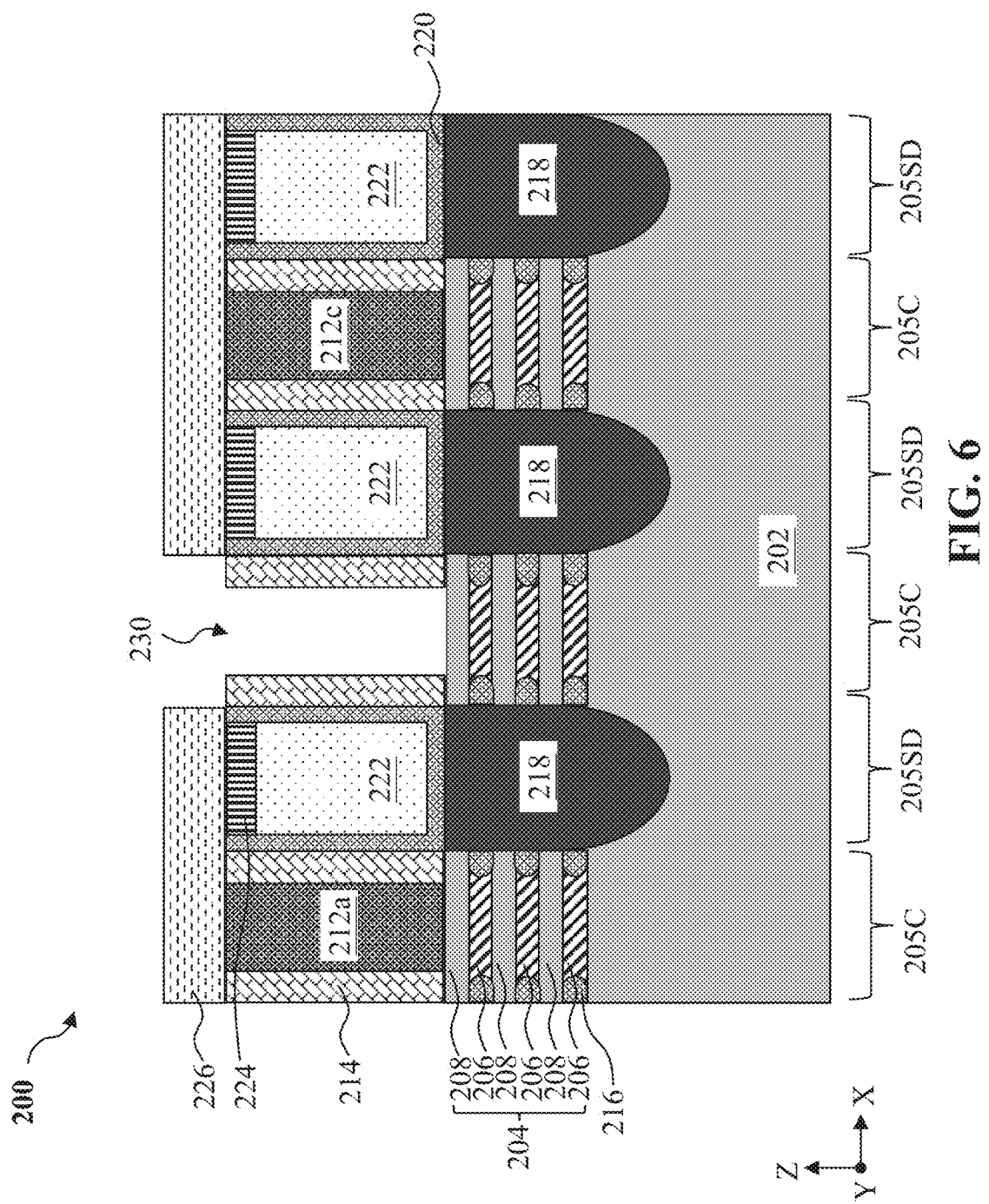
Figure 7:
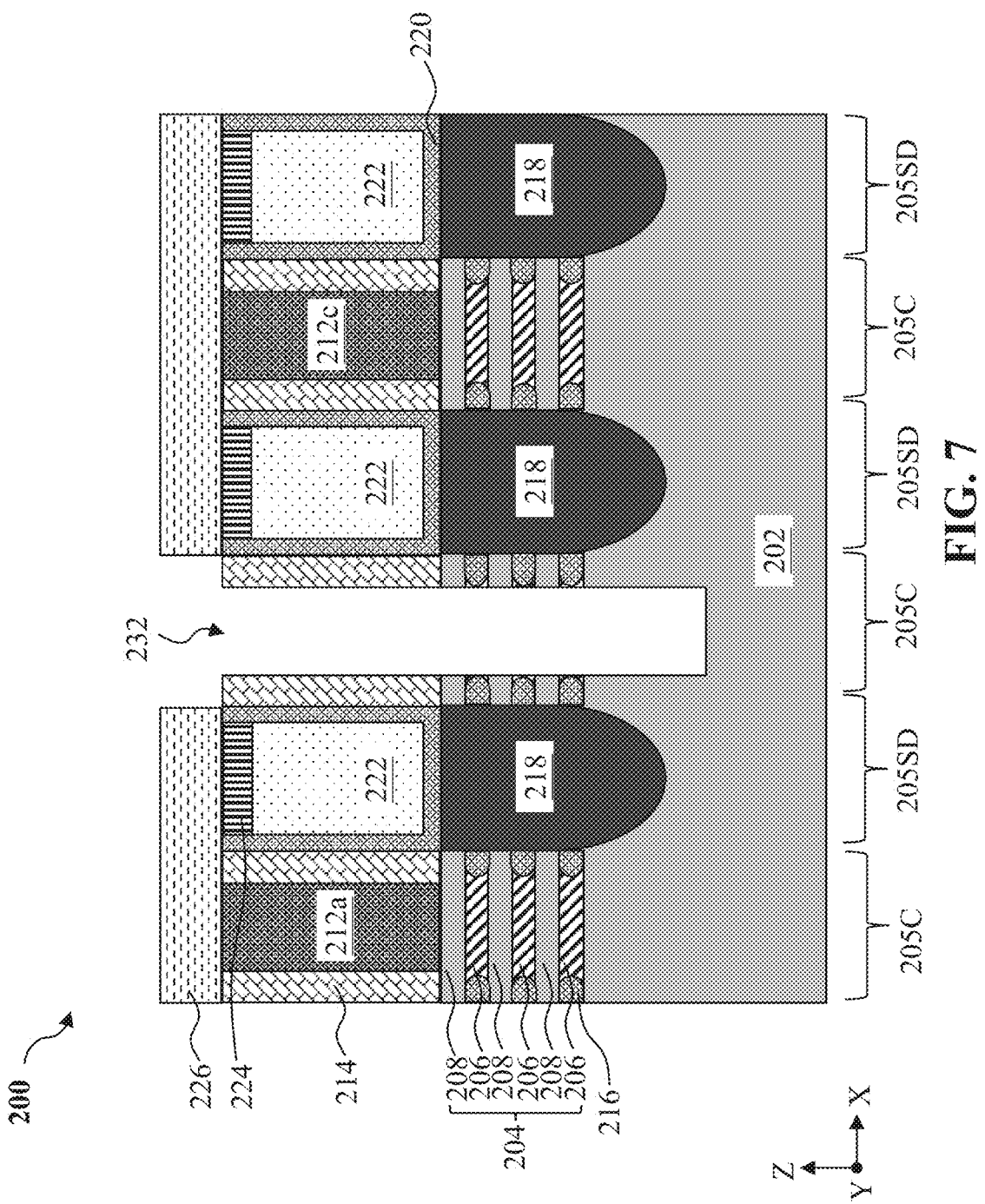
Figure 8:
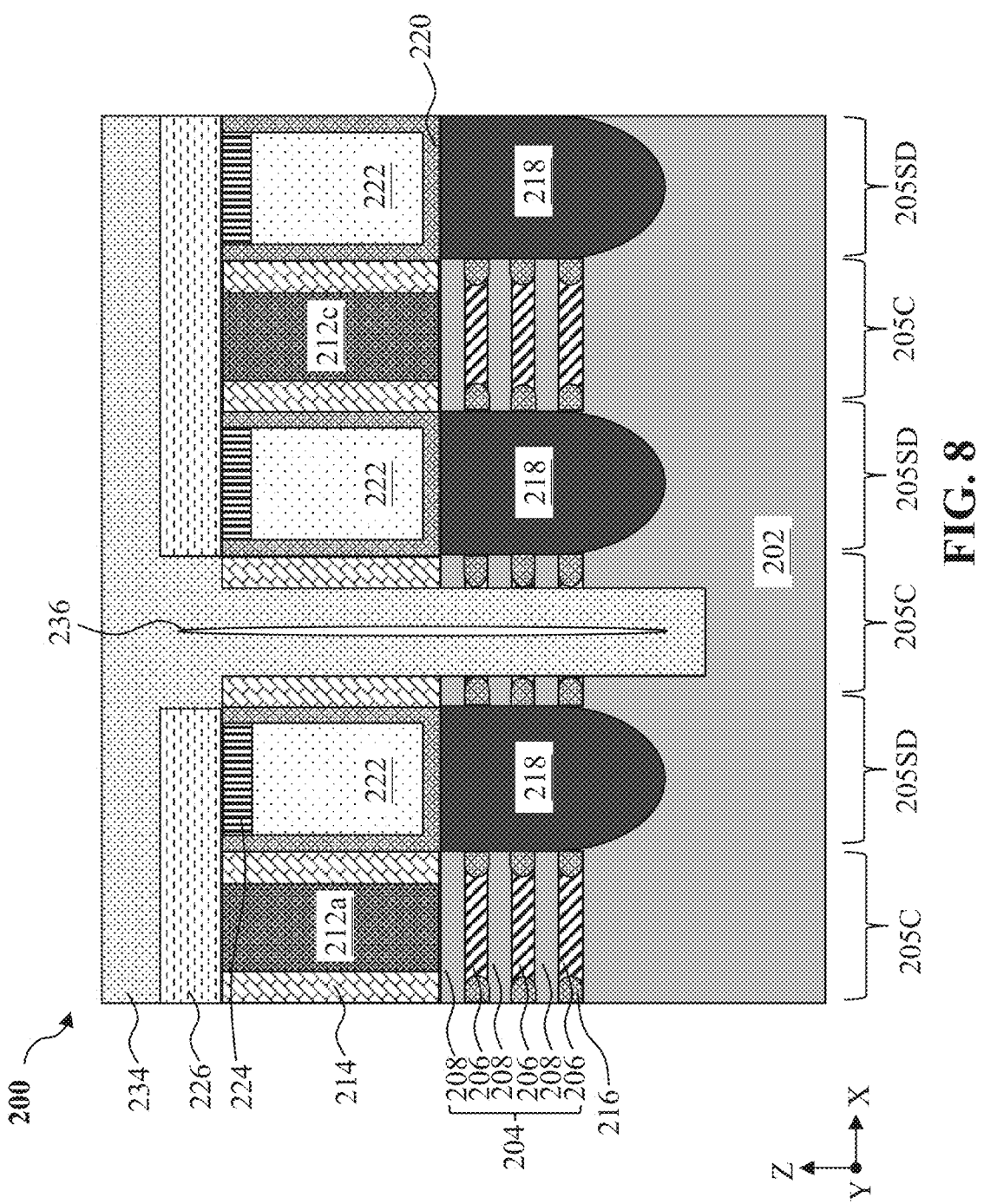

Referring to FIGS. 1 and 5-7, method 100 includes a block 106 where the dummy gate structure 212b, a portion of the fin-shaped active region 205 and a portion of the substrate 202 disposed directly under the dummy gate structure 212b are removed to form an isolation trench 232 (shown in FIG. 7). In embodiments represented in FIG. 5, a hard mask layer 226 is formed over the workpiece 200. The hard mask layer 226 may include silicon oxide, SiN, SiCN, SiOC, SiON, SiOCN, Si, other suitable materials, or combinations thereof, and may be formed by CVD, ALD, PVD, other suitable methods, or combinations thereof. In the present embodiments, the hard mask layer 226 and the hard mask layer 224 include substantially the same composition such as, for example, SiN. The hard mask layer 226 is subsequently patterned to form an opening 228 configured to selectively expose at least portions of the dummy gate structure 212b. For example, a masking element (not depicted) including a photoresist layer may be formed over the hard mask layer 226, exposed to a radiation source through a patterned mask, and subsequently developed to form a patterned masking element. The hard mask layer 226 may then be etched using the patterned masking element as an etch mask to form the opening 228 that exposes at least portions of the dummy gate structure 212b but not the dummy gate structures 210a and 210c. In some embodiments, the opening 228 spans a width along the X direction that is greater than a width of the dummy gate structure 212b along the X direction. In some embodiments, the hard mask layer 226 is patterned to expose the dummy gate structure 210b in its entirety along the Y axis, i.e., the opening 228 exposes all of the fin-shaped active region 205 over which the dummy gate structure 210b is disposed. Accordingly, the dimension of the opening 228 along the Y axis corresponds to the dimension of the CPODE structure to be formed in place of the dummy gate structure 210b. In some other embodiments, the opening 228 may partially expose the dummy gate structure 210b (e.g., exposes a portion of the dummy gate structure 210b disposed over a first fin-shaped active region but not the portions disposed over a second fin-shaped active region).

In embodiments represented in FIG. 6, while using the patterned hard mask layer 226 as an etch mask, the dummy gate structure 210b exposed by the opening 228 is selectively removed to form a trench 230 between the gate spacers 214. An etching process may be implemented to selectively remove the dummy gate structure 210b without substantially etching the gate spacers 214. The etching process may be a dry etching process, a wet etching process, an RIE process, or combinations thereof that implements a suitable etchant. The trench 230 exposes the portion of the fin-shaped active region 205 that was covered by the dummy gate structure 210b.

After forming the trench 230, as represented in FIG. 7, a portion of the fin-shaped active region 205 and a portion of the substrate 202 directly under the trench 230 are removed. An etching process is implemented to extend the trench 230 vertically downward to expose the substrate 202. In the present embodiments, after performing the operations in block 106, an isolation trench 232 extending to the substrate 202 is formed. Since the isolation trench 232 is formed by extending the trench 230, the isolation trench 232 may also be referred to as an extended trench 230. In an embodiment, the isolation trench 232 extends to below a bottom surface of the bottommost sacrificial layer 206. In embodiments represented in FIG. 7, the isolation trench 232 extends vertically beyond a bottom surface of the epitaxial source/drain features 218. In some embodiments, the isolation trench 232 may have substantially vertical sidewalls. In an embodiment, the isolation trench 232 is a tapered trench and the channel region 205C of the fin-shaped active region 205 is not fully removed such that the source/drain features 218 adjacent to the channel region 205C are not substantially damaged.

Referring to FIGS. 1 and 8-10, method 100 includes a block 108 where an isolation structure 235 is formed over the workpiece 200 to substantially fill the isolation trench 232. In embodiments represented in FIGS. 8-10, the formation of the isolation structure 235 includes forming a dielectric material layer 234 over the workpiece 200 to substantially fill the isolation trench 232. In some embodiments, the dielectric material layer 234 may be formed by any suitable method, including CVD, FCVD, ALD, PVD, other methods, or combinations thereof. During the deposition of the dielectric material layer 234, one or more seams 236 (i.e., voids or air gaps) may be formed due to, for example, the aspect ratio of the isolation trench 232. The dielectric material layer 234 is selected to have a composition different from that of the hard mask layer 224 and that of the CESL 220 to ensure that the to-be-formed isolation structure 235 possesses a high etch selectivity with respect to these material layers. In addition, to reduce the parasitic capacitance of the final structure of the workpiece 200, the dielectric material layer 234 may be formed of a low-k material. For example, the dielectric material layer 234 may include silicon oxide, TEOS, doped silicon oxide (e.g., BPSG, FSG, PSG, BSG, etc.), combinations thereof, or other suitable materials. In some embodiments, the dielectric material layer 234 is formed of an oxide layer. In an embodiment, the hard mask layer 224 and the CESL 220 are formed of silicon nitride, the dielectric material layer 234 is formed of silicon oxide.

Figure 9:
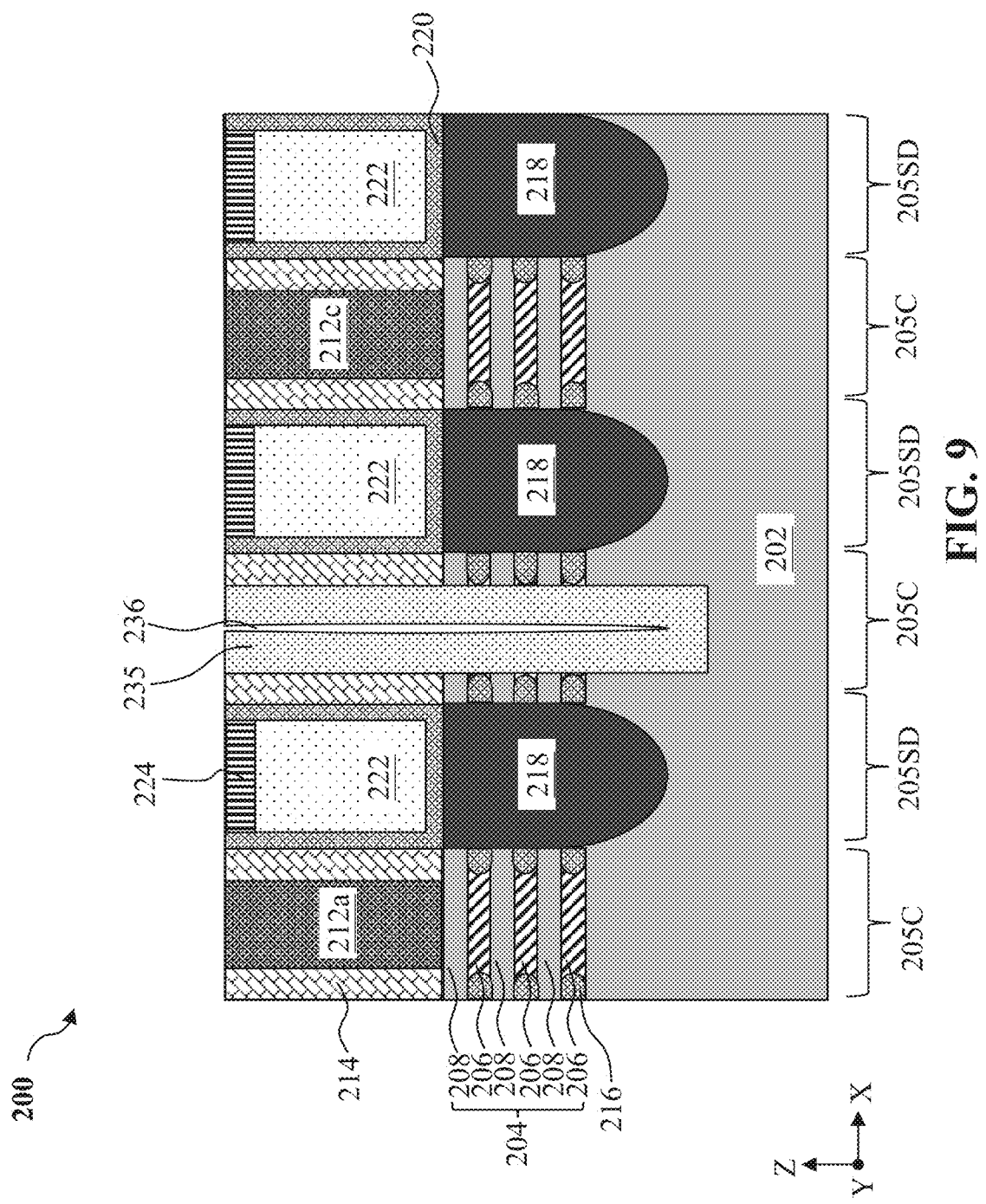
Figure 10:
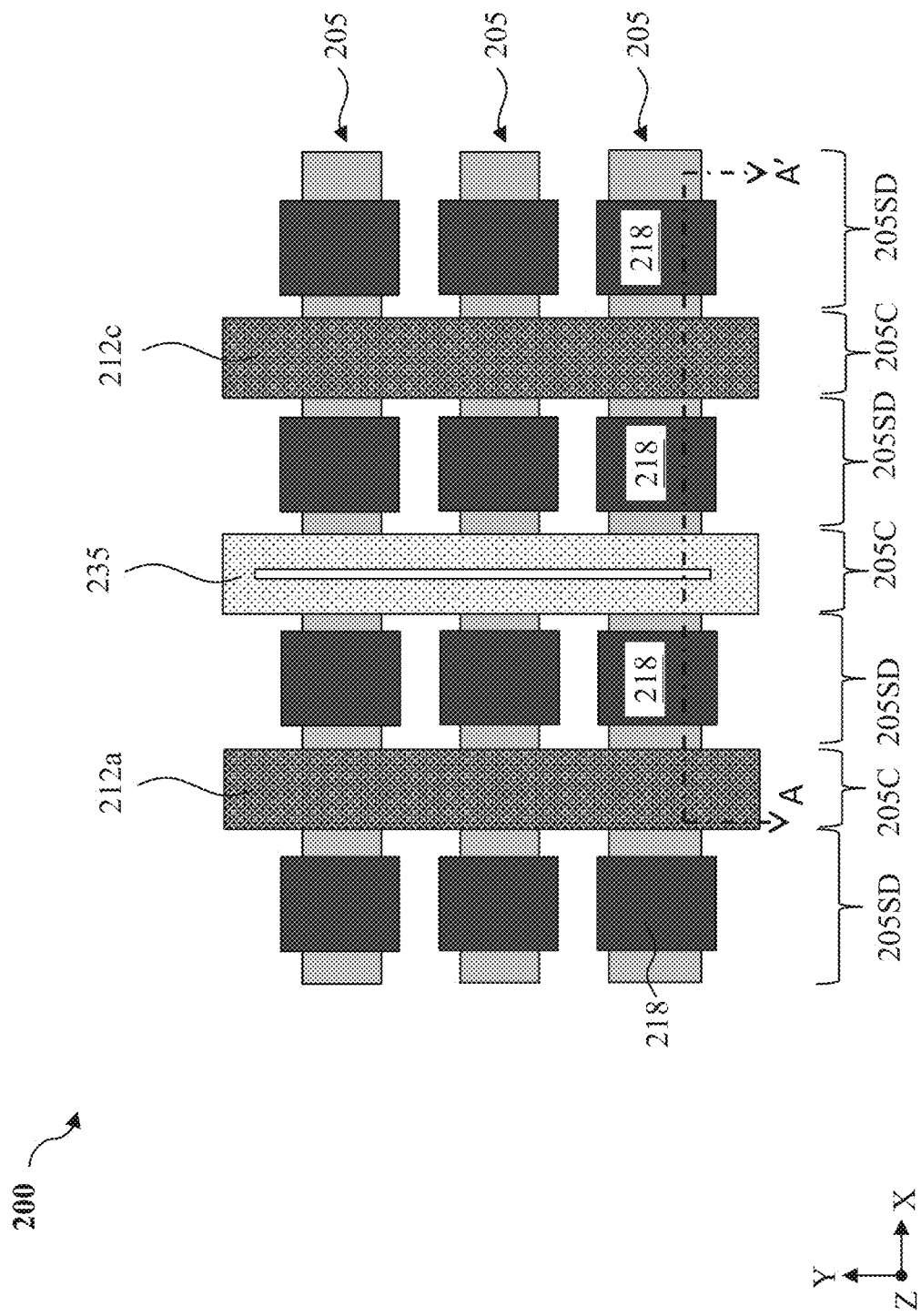
FIG. 10 illustrates a fragmentary top view of a semiconductor structure shown in FIG. 9, according to various embodiments of the present disclosure.

Subsequently, after forming the dielectric material layer 234, as shown in FIG. 9, a planarization process (e.g., CMP) is performed to remove excess materials to expose a top surface of the hard mask layer 224 to form the isolation structure 235 in the isolation trench 232. The isolation structure 235 may be referred to as a CPODE structure 235. In the present embodiment, the planarization process stops when top surfaces of the hard mask layer 224 and the dummy gate structures 212a and 212c are exposed. That is, the hard mask layer 226 and portions of the dielectric material layer 234 over the top surface of the hard mask layer 224 are removed. After the planarization process, a top surface of the CPODE structure 235 is coplanar with top surfaces of the hard mask layer 224 and the dummy gate structures 212a and 212c. FIG. 10 depicts a fragmentary top view of the workpiece 200 in FIG. 9. In embodiments represented in FIG. 10, the CPODE structure 235 extends lengthwise along the Y direction and has a length that is substantially equal to the dimension of the dummy gate structure 212a along the Y direction. While not depicted herein, the length of the CPODE structure 235 along the Y direction may be smaller than the dimension of the dummy gate structure 212a along the Y direction.

Figure 11:
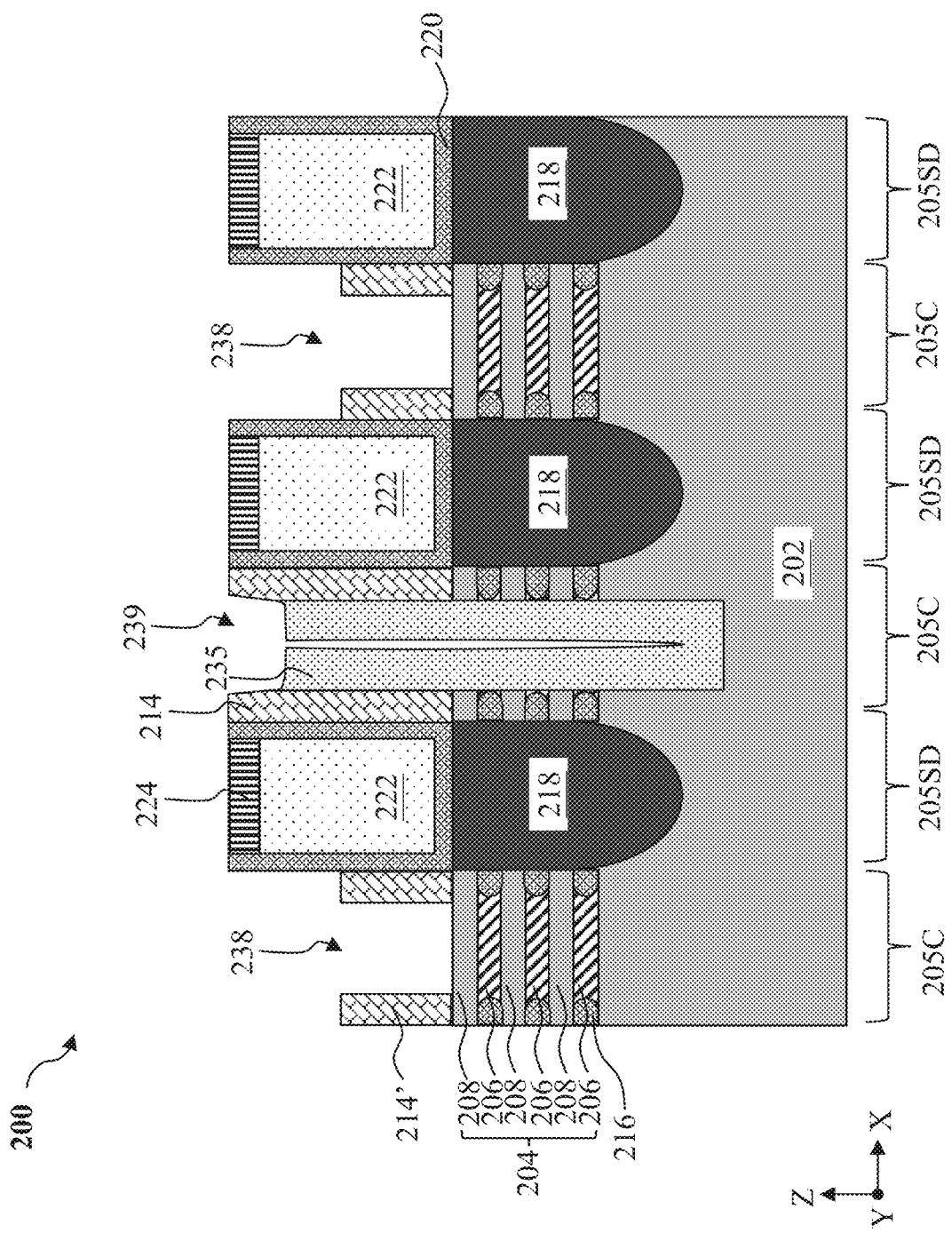

Referring to FIGS. 1 and 11, method 100 includes a block 110 where the dummy gate structures 210a and 210c are selectively removed to form gate trenches 238. In an embodiment, a first etching process may be performed to selectively remove the dummy gate electrode of the dummy gate structures 210a and 210c and a second etching process may be performed to selectively remove the dummy gate dielectric layer of the dummy gate structures 210a and 210c. The first etching process may be implemented with a dry etching process, a wet etching process, RIE, or combinations thereof. For example, the first etching process may include implementing a combination of a dry etching process and a wet etching process utilizing suitable etchants. In some embodiments, as depicted herein, the first etching process also removes top portions of the gate spacers 214, such that a top surface of the gate spacers 214 is below a top surface of the hard mask layer 224. The partially recessed gate spacer 214 may be referred to as gate spacer 214'. The second etching process may be then performed to selectively remove the dummy gate dielectric layer of the dummy gate structures 210a and 210c. In embodiments where the dummy gate dielectric layer of the dummy gate structures 210a and 210c and the CPODE structure 235 are formed of a same material (e.g., silicon oxide), a top portion of the CPODE structure 235 is also removed by the second etching process. In embodiments represented in FIG. 11, due to the selective removal of the dummy gate structures 210a and 210c, a recess 239 is formed over the CPODE structure 235.

Figure 12:
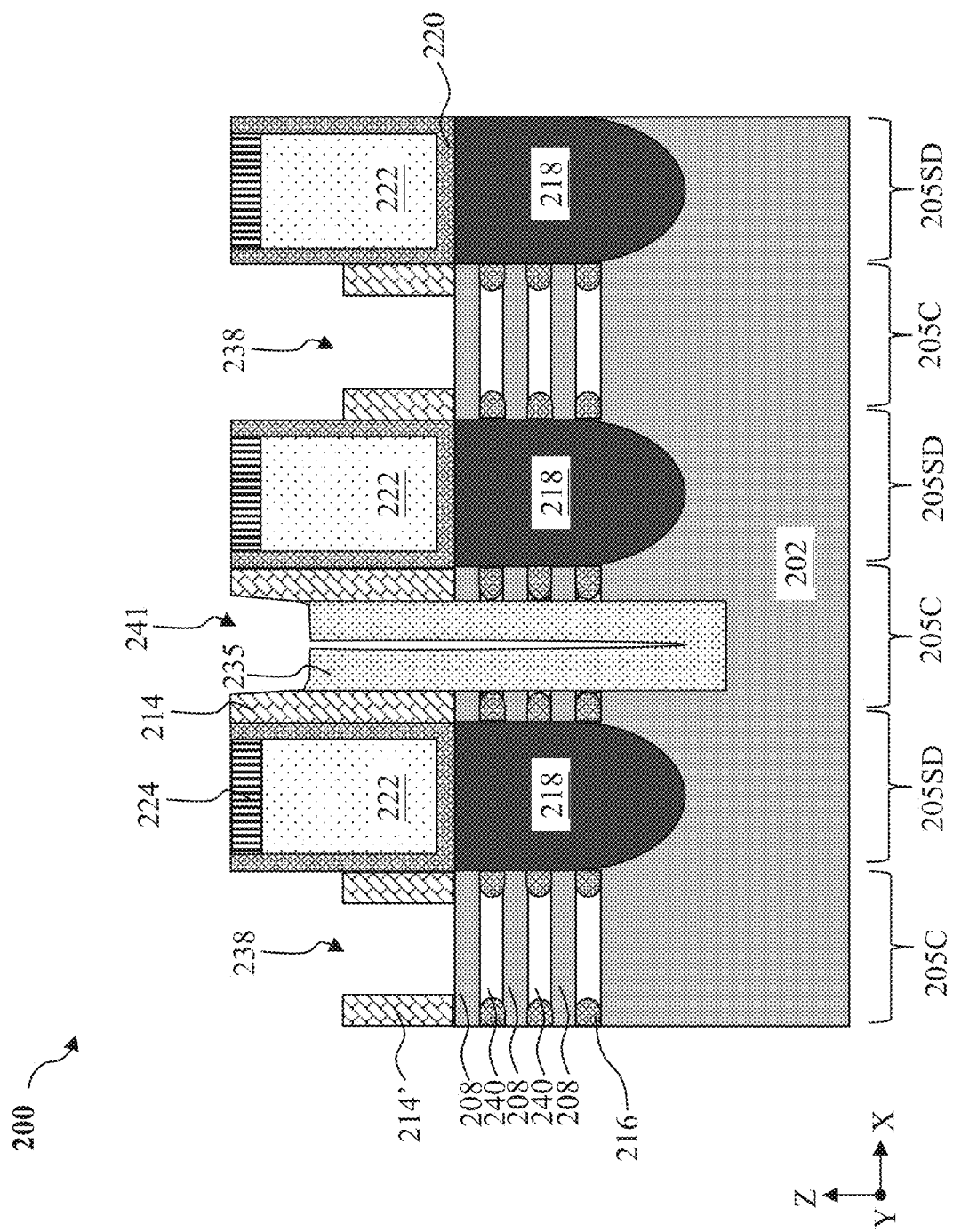

Referring to FIGS. 1 and 12, method 100 includes a block 112 where sacrificial layers 206 are selectively removed to form a number of openings 240. After the selective removal of the dummy gate structures 212a and 212c, referring to FIG. 12, an etching process is performed to selectively remove the sacrificial layers 206 from the vertical stack 204 to release the channel layers 208 as channel members 208. The selective removal of the sacrificial layers 206 forms openings 240 between the channel layers 208 along the Z direction and between the inner spacer features 216 along the X direction. In the present embodiments, the channel release process selectively removes the sacrificial layers 206 without removing, or substantially removing, the channel layers 208. In other words, the openings 240 are interleaved with the channel layers 208. In some embodiments, the channel release process is implemented in a series of etching and trimming processes. In one example, a wet etching process employing an oxidant (or oxidizer) such as ozone ($O_3$; dissolved in water), nitric acid ($HNO_3$), hydrogen peroxide ($H_2O_2$), other suitable oxidants, and a fluorinebased etchant such as hydrofluoric acid (HF), ammonium fluoride (NH$_4$F), other suitable etchants, or combinations thereof may be performed to selectively remove the sacrificial layers 206. The series of etching and trimming processes used in the channel release process may slightly etch the CPODE structure 235. In embodiments represented in FIG. 12, the recess 239 formed over the CPODE structure 235 is enlarged, the enlarged recess 239 may be referred to as a recess 241.

Figure 13:
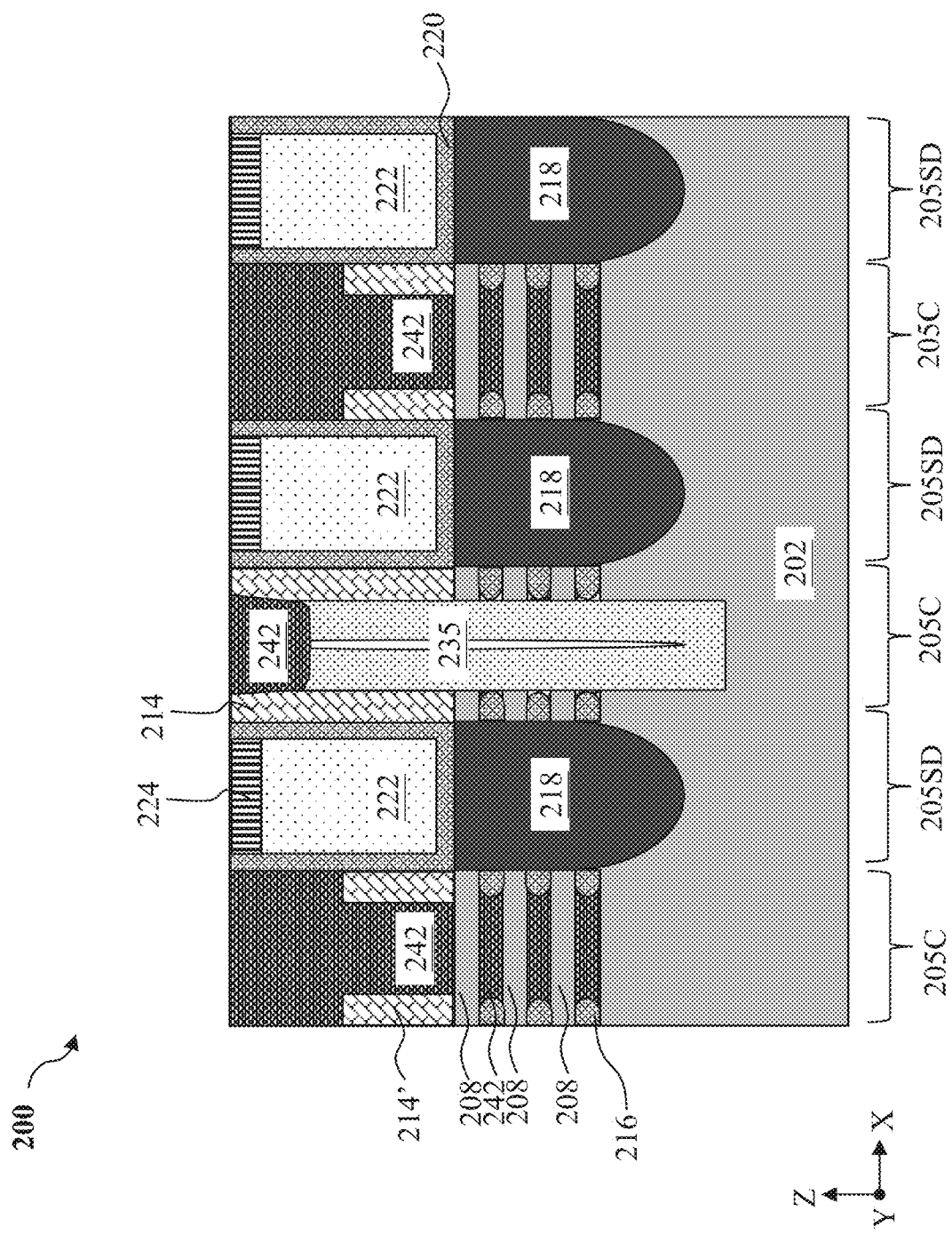
Figure 14:
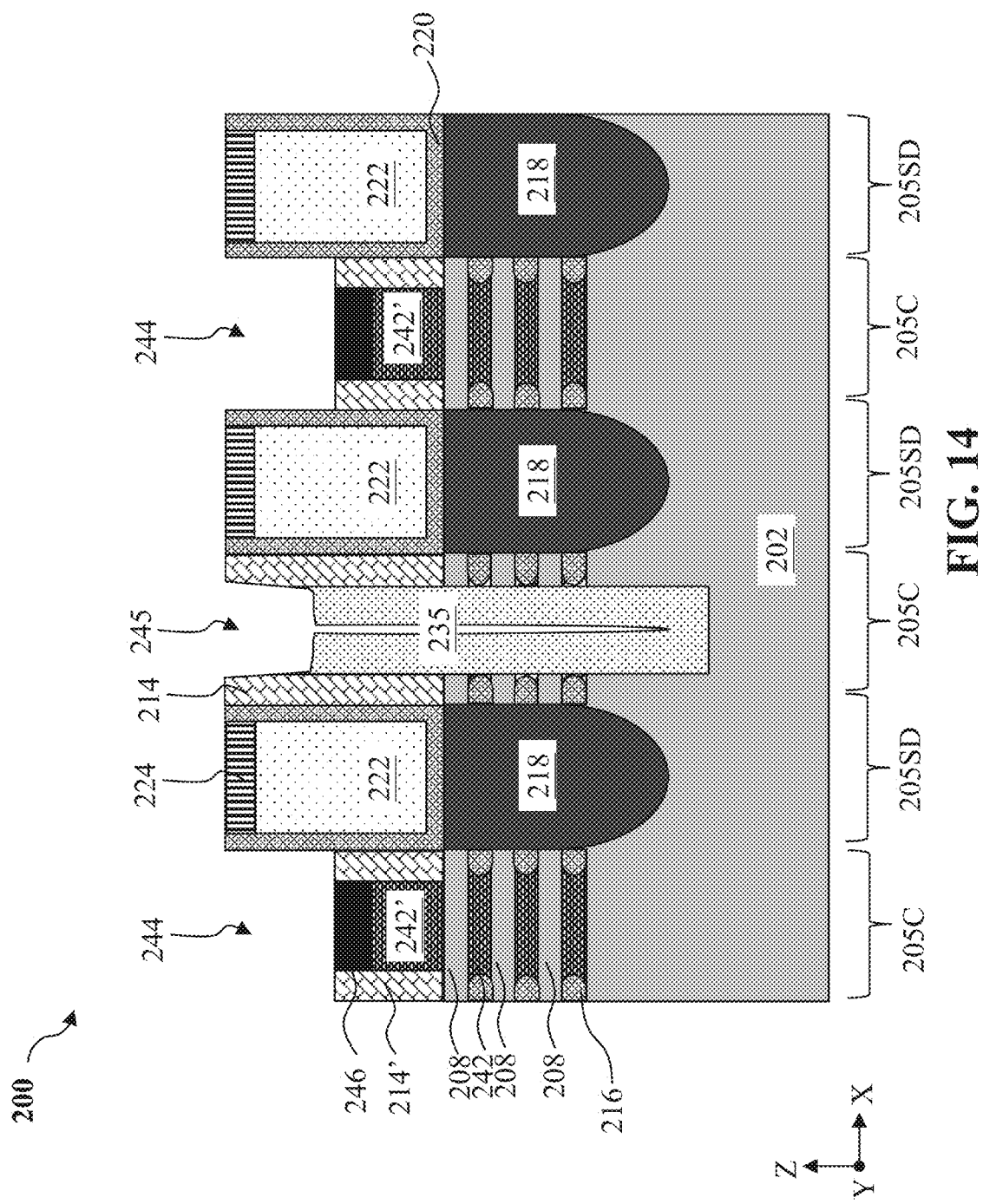

Referring to FIGS. 1 and 13-14, method 100 includes a block 114 where a gate stack 242 is formed in the number of openings 240 and in the gate trench 238 to wrap around and over each of the channel members 208. As such, portions of the gate stack 242 formed in the openings 240 are interleaved with or wrapping around the channel layers 208. In the present embodiments, the gate stack 242 includes a gate dielectric layer (not shown) and a metal gate electrode (not shown) over the gate dielectric layer. The gate dielectric layer may include a high-k (having a dielectric constant greater than that of silicon oxide, which is approximately 3.9) dielectric material, such as hafnium oxide, lanthanum oxide, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, ZrSi$_2$, MoSi$_2$, TaSi$_2$, NiSi$_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The gate stack 242 may further include other material layers (not depicted). Material layers of the gate stack 242 may be formed by various methods, including ALD, CVD, PVD, plating, other suitable methods, or combinations thereof. In embodiments where the workpiece 200 includes the recess 241, the gate stack 242 also substantially fills the recess 241, as shown in FIG. 13. A planarization process is then performed to planarize the top surface of the workpiece 200 by implementing one or more CMP process. The planarization process may stop until the top surface of the hard mask layer 224 is exposed. That is, after the planarization process, a top surface of the gate stack 242 is coplanar with the top surface of the hard mask layer 224. Accordingly, comparing with the workpiece 200 as depicted in FIGS. 3-4, at least one of the dummy gate structures (i.e., the dummy gate structures 210a and 210c) has been replaced in its entirety with a gate stack (i.e., the gate stack 242), while another one of the dummy gate structures (i.e., the dummy gate structure 210b) has been at least partially replaced with the CPODE structure 235.

Subsequently, an etching process is performed to recess or etch back a top portion of the gate stack 242 to form a capping recess 244 over the recessed gate stack 242 and remove the portion of the gate stack 242 formed in the recess 241. The recessed gate stack 242 may be referred to as gate stack 242'. In the present embodiments, the etching process selectively removes the top portion of the gate stack 242, including at least portions of the gate dielectric layer and the gate electrode, without removing, or substantially removing, the hard mask layer 224 and the gate spacers 214'. In some embodiments, the etching process further etches the CPODE structure 235, thereby forming a further enlarged recess 245 over the CPODE structure 235.

The etching process may be implemented by any suitable method, including a dry etching process, a wet etching process, RIE, other suitable methods, or combinations thereof, utilizing one or more etchant configured to etch components of the gate stack 242. In the present embodiments, a depth of the capping recess 244 is controlled by tuning one or more parameters, such as etching duration, where a longer etching duration increases the depth of the capping recess 244. In an embodiment, after the etching process, a height of the gate stack 242' is smaller than a height of the gate spacers 214'. That is, a top surface of the gate stack 242' is lower than a top surface of the gate spacers 214'. In some embodiments, an optional metal layer 246 (e.g., tungsten) may be formed on the gate stack 242' to reduce a gate resistance of the workpiece 200.

Figure 15:
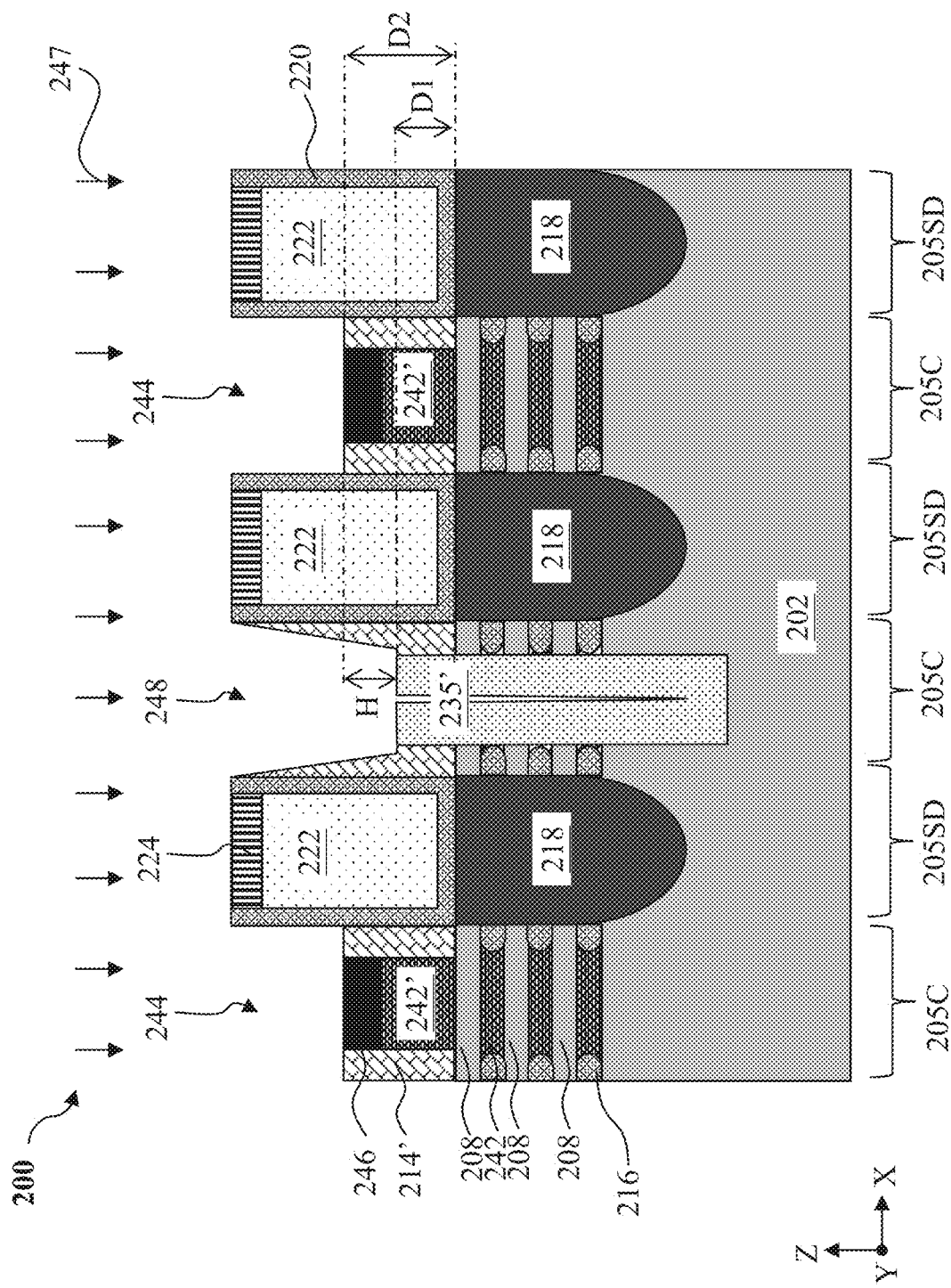

Referring to FIGS. 1 and 15, method 100 includes a block 116 where the CPODE structure 235 is selectively recessed to form a capping recess 248 over the recessed CPODE structure 235. In this embodiment, an etching process 247 is performed to selectively recess the CPODE structure 235 without substantially etching the gate spacer 214', the hard mask layer 224, the CESL 220, the gate stack 242 and the metal layer 246. The remaining CPODE structure 235 after performing of the etching process 247 may be referred to as a CPODE structure 235'. The etching process 247 may be implemented with a dry etching process, a wet etching process, RIE, or combinations thereof. In some embodiments, the CPODE structure 235' is formed of silicon oxide, the gate spacer 214', the hard mask layer 224 and the CESL 220 are formed of silicon nitride, and the etching process 247 may be in a way similar to the second etching process used to selectively remove the dummy gate dielectric layer described with reference to FIG. 11. In some embodiments, due to the etching duration of the etching process 247, the gate spacers 214 exposed by the recess 245 may be slightly recessed, thereby forming a tapered capping recess 248. After the performing of the etching process 247, a top surface of the CPODE structure 235' is substantially coplanar with or lower than a top surface of the recessed gate stack 242 and is above a top surface of the topmost channel layer 208. In embodiments where the workpiece 200 includes the metal layer 246, a top surface of the CPODE structure 235' is substantially coplanar with or lower than a top surface of the metal layer 246 such that the self-aligned capping layer 254 (shown in FIG. 17) that would be formed over the CPODE structure 235' is not fully removed during the formation of the self-aligned capping layer 252 (shown in FIG. 17). That is, even after the performing of a planarization process that is configured to remove excess portions of a capping material layer 250, there would be a self-aligned capping layer 254 formed on the CPODE structure 235'. The depth of the recess 245 and a height of the CPODE structure 235' may be controlled by the duration of the etching process 247. In an embodiment, a distance D1 between a top surface of the topmost channel layer 208 and a top surface of the CPODE structure 235' may be between about 2 nm and about 30 nm. In an embodiment, a distance D2 between the top surface of the topmost channel layer 208 and a top surface of the metal layer 246 may be equal to or greater than the distance D1. In other words, a distance difference H between the distance D1 and the distance D2 is no less than 0 nm. In some embodiments, the distance D2 may be between about 8 nm and about 35 nm.

Figure 16:
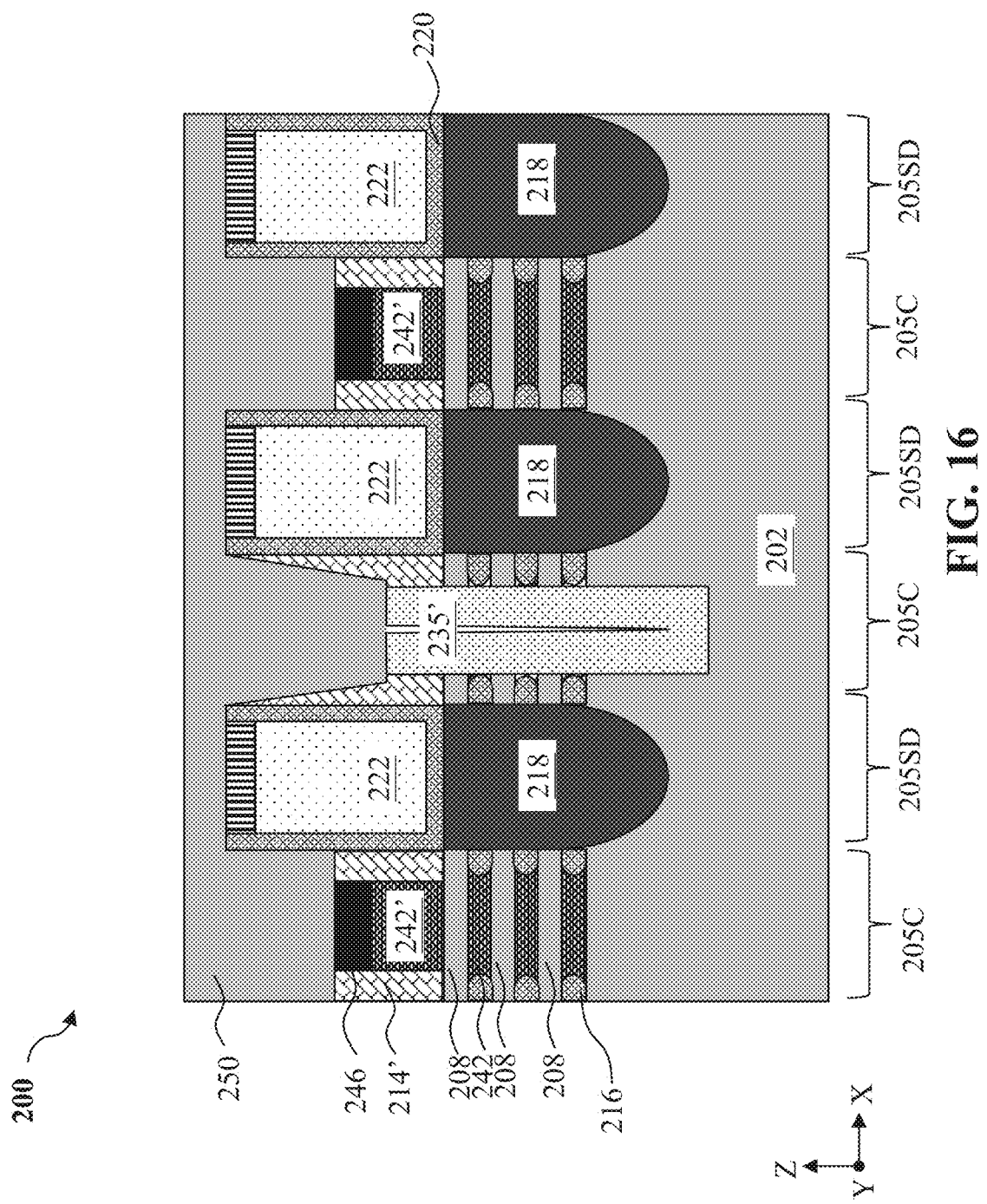
Figure 17:
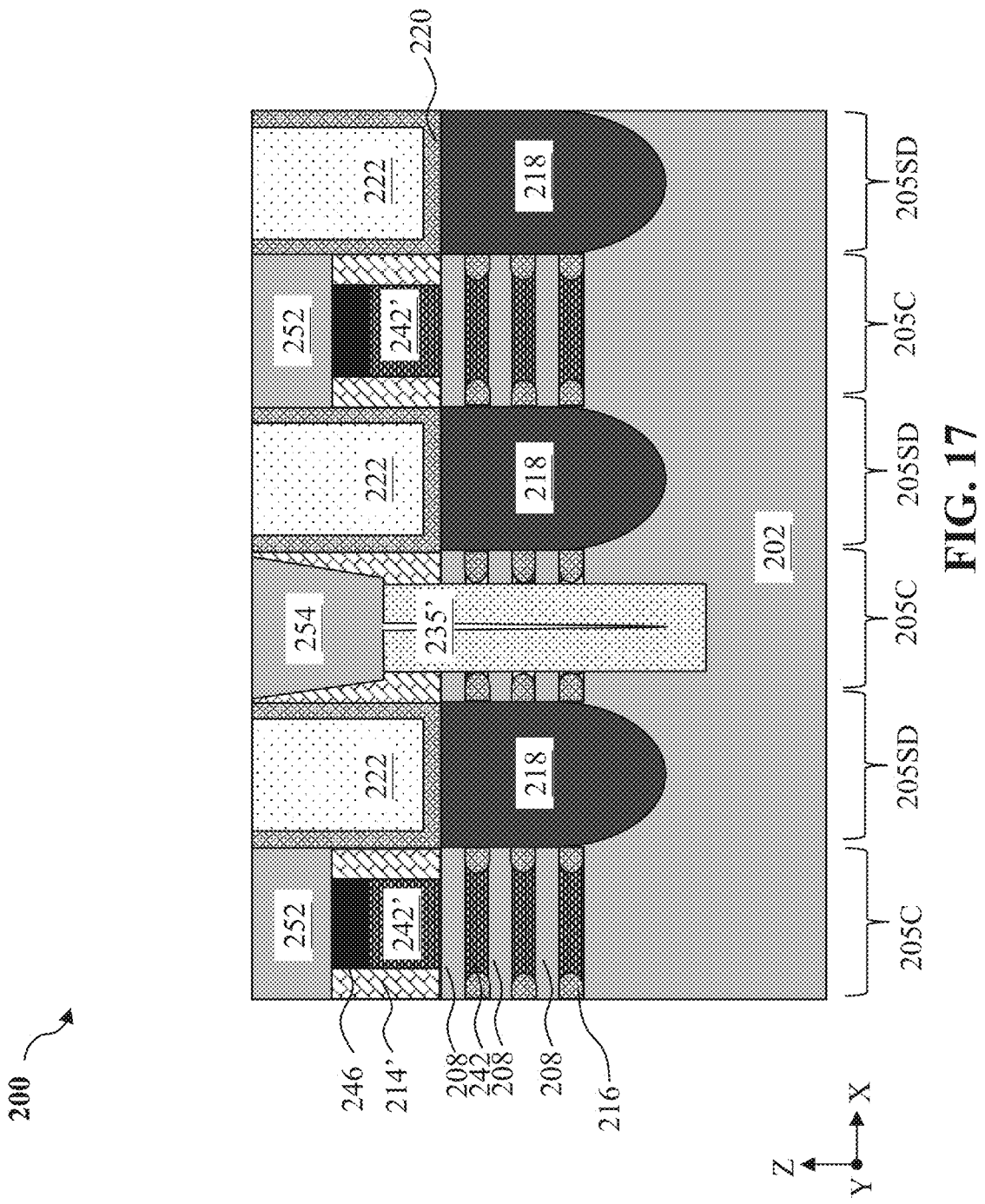

Referring to FIGS. 1 and 16-17, method 100 includes a block 118 where a self-aligned capping layer 252 is formed in the capping recess 244 and a self-aligned capping layer 254 is formed in the capping recess 248. The formation of the self-aligned capping layers 252 and 254 includes forming a capping material layer 250 over the workpiece 200 to substantially fill the capping recess 244 and the capping recess 248. In some embodiments, the capping material layer 250 may be formed by any suitable method, including CVD, FCVD, ALD, PVD, other methods, or combinations thereof. The capping material layer 250 is selected to have a composition different from that of the CESL 220 and that of the ILD layer 222 to ensure that the self-aligned capping layers 252 and 254 formed from the capping material layer 250 possess a high etch selectivity with respect to the CESL 220 and the ILD layer 222. As such, during the formation of source/drain contacts, the self-aligned capping layers 252 and 254 may be kept substantially intact, and the CPODE structure 235' may be protected during those etching processes. In some embodiments, the CESL 220 is formed of silicon nitride, the ILD layer 222 is formed of silicon oxide, and the capping material layer 250 may be formed of silicon, boron nitride, silicon oxycarbide, or other suitable materials that possess a high etch selectivity with respect to silicon nitride and silicon oxide. In an embodiment, the capping material layer 250 is formed of silicon.

Subsequently, after forming the capping material layer 250, as shown in FIG. 17, a planarization process (e.g., CMP) is performed to remove excess materials to expose a top surface of the ILD layer 222 to form the self-aligned capping layer 252 in the capping recess 244 and to form the self-aligned capping layer 254 in the capping recess 248. The self-aligned capping layer 252 is formed over the gate stack 242', the self-aligned capping layer 254 is formed over the CPODE structure 235'. In the present embodiments, the planarization process stops when a top surface of the ILD layer 222 is exposed. That is, the hard mask layer 224 and portions of the capping material layer 250 over the top surface of the ILD layer 222 are removed. After the planarization process, a top surface of the self-aligned capping layer 254 is coplanar with top surfaces of the ILD layer 222 and the self-aligned capping layer 252. The self-aligned capping layer 254 tracks the shape of the capping recess 248 and the self-aligned capping layer 252 tracks the shape of capping recess 244. That is, a thickness of the self-aligned capping layer 254 along the Z direction is substantially equal to or greater than a thickness of the self-aligned capping layer 252 along the Z direction. If a top surface of the CPODE structure 235' is above a top surface of the metal layer 246, in some embodiments, after the planarization process used to remove excess portions of the capping material layer 250, the workpiece 200 may still include the self-aligned capping layer 252 formed directly over the gate stack 242', but not include the self-aligned capping layer 254 formed directly over the CPODE structure 235', leading to the oxide CPODE structure 235' vulnerable to subsequent etching processes (e.g., etching process 256). Therefore, it is critical that the top surface of the CPODE structure 235' is not above the top surface of the metal layer 246 or the top surface of the gate stack 242'. In other words, a bottom surface of the self-aligned capping layer 254 is below or coplanar with a bottom surface of the self-aligned capping layer 252.

Figure 18:
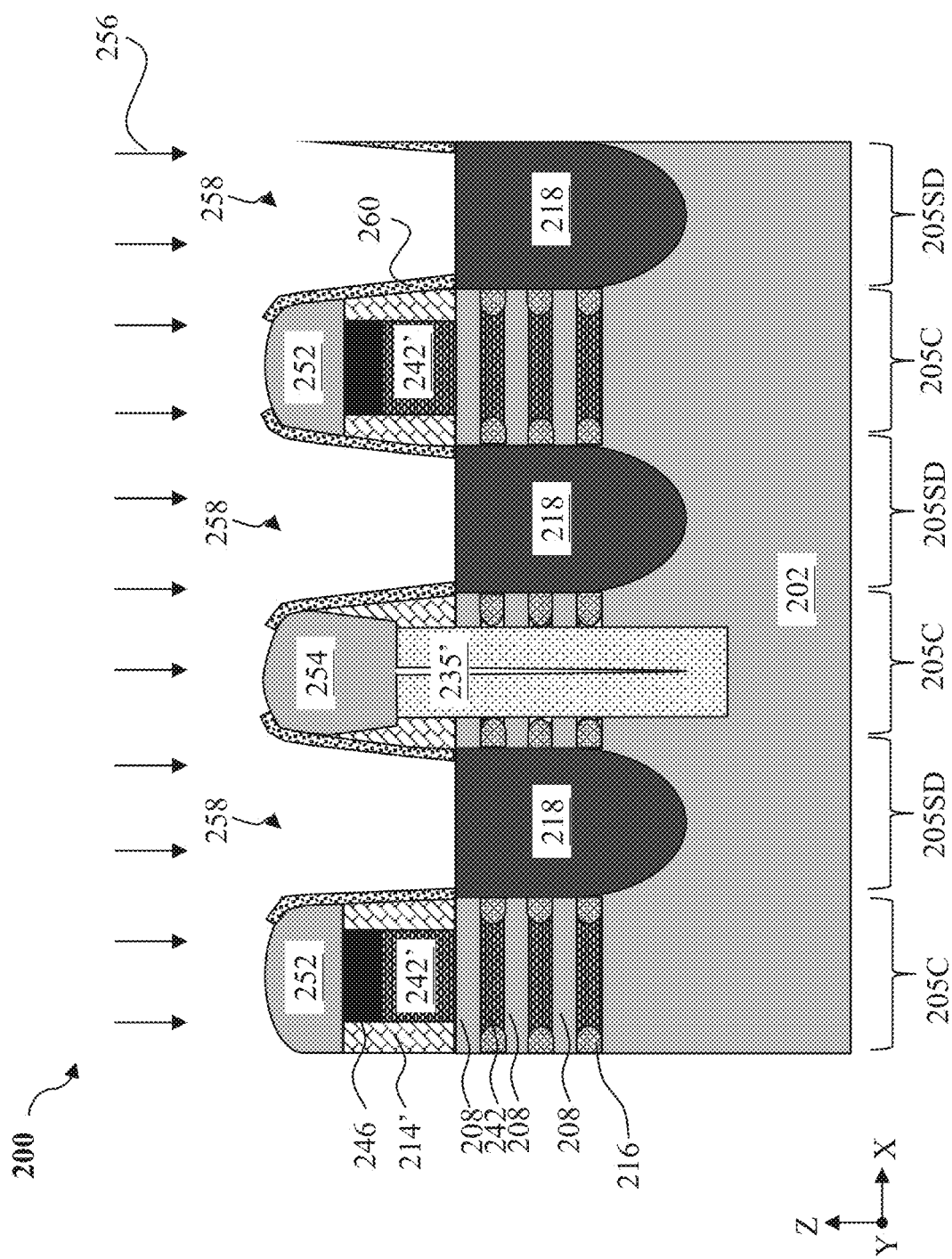

Referring to FIGS. 1 and 18, method 100 includes a block 120 where portions of the ILD layer 222 and the CESL 220 formed directly over the source/drain features 218 are selectively removed to form source/drain contact openings 258. An etching process 256 is performed to selectively remove the ILD layer 222 and the CESL 220 without substantially etching the self-aligned capping layers 252 and 254. In some embodiments, the etching process 256 may include dry etching, wet etching, RIE, and/or other etching methods. In an embodiment, an anisotropic dry etching is used to selectively remove the ILD layer 222 and the CESL 220 at a greater rate than does the self-aligned capping layers 252 and 254 using a proper etchant gas, such as one or more fluorine-containing or chlorine-containing gas. Due to the high etch selectivity between the self-aligned capping layers 252 and 254 and the dielectric layers (i.e., the ILD layer 222 and the CESL 220) over the source/drain features 218, a total height of the self-aligned capping layer 254 and the CPODE structure 235' thereunder would be substantially unchanged during the formation of the source/drain contact openings 258. If the CPODE structure 235' is formed of materials that have a low etch selectivity with the ILD layer 222 and the CESL 220 and is not covered by the self-aligned capping layer 254, for example, if the CPODE structure 235' includes a silicon oxide layer embedded in a silicon nitride layer and is not protected by the self-aligned capping layer 254, after forming the source/drain contact openings 258, the CPODE structure 235' would be recessed to have a reduced height, leading to unintentional electrical shorting between two adjacent source/drain contacts that would be formed in subsequent processes.

After forming the source/drain contact openings 258, in embodiments represented in FIG. 18, a dielectric barrier layer 260 may be formed to extend along sidewall surfaces of the source/drain contact openings 258. In this depicted example, a dielectric layer is conformally formed over the workpiece 200 (including on top surfaces of the self-aligned capping layers 252 and 254 and the source/drain features 218, and sidewall surfaces of the exposed gate spacers 214 and self-aligned capping layers 252 and 254) and is then etched back to only cover sidewalls of the source/drain contact openings 258 and expose the source/drain feature 218. In some embodiments, the dielectric barrier layer 260 may include silicon nitride or other suitable materials. In embodiments where the remaining gate spacer 214' would provide a satisfactory isolation between the gate stack 242' and the to-be-formed source/drain contacts 264, the workpiece 200 may not include the dielectric barrier layer 260.

Figure 19:
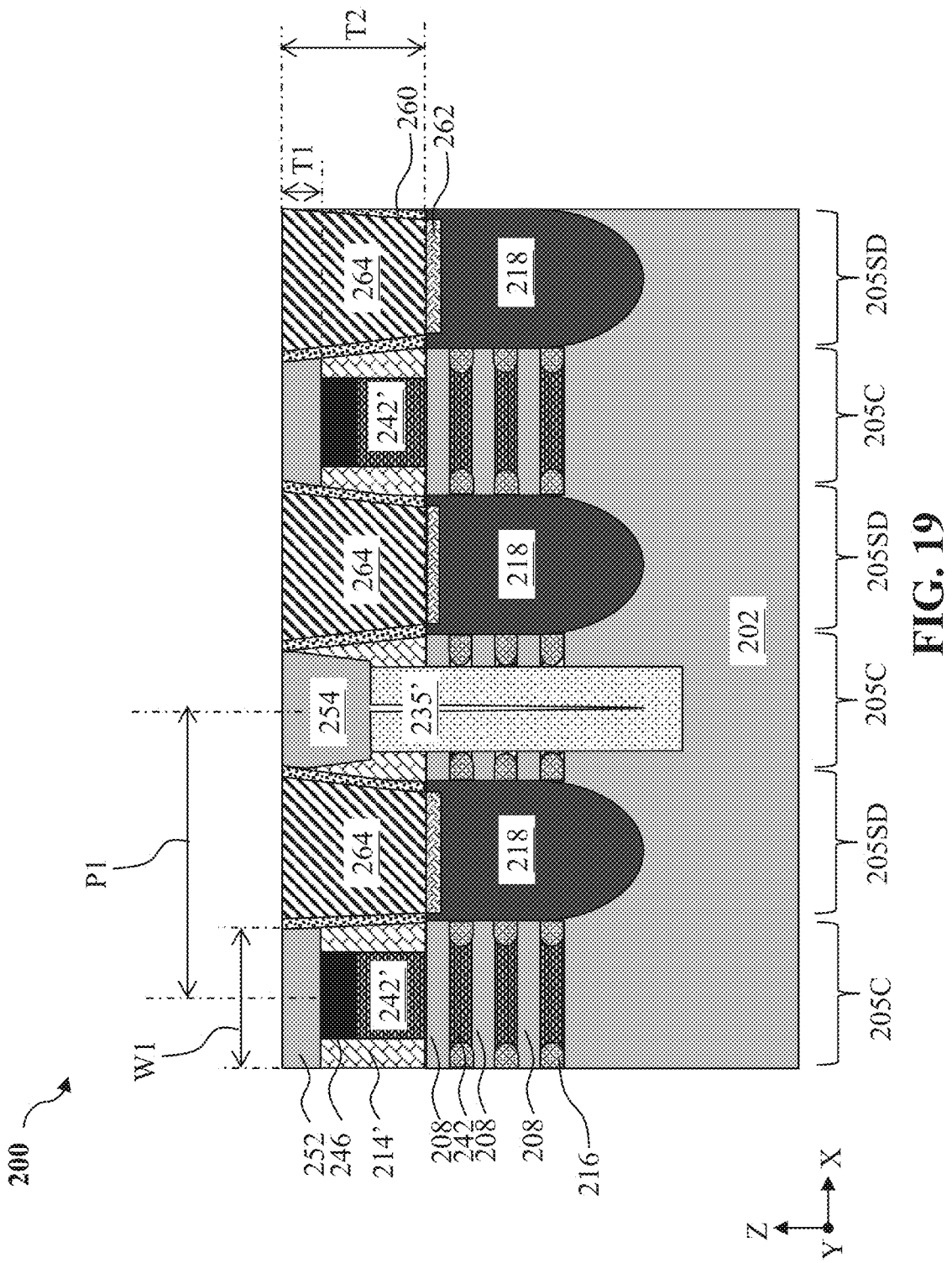

Referring to FIGS. 1 and 19, method 100 includes a block 122 where silicide layers 262 and source/drain contacts 264 are formed. The formation of the silicide layer 262 on the exposed surface of the source/drain feature 218 may reduce a contact resistance between the source/drain feature 218 and the to-be-formed source/drain contact 264. To form the silicide layer 262, a metal layer is deposited over the exposed surfaces of the source/drain feature 218 and an anneal process is performed to bring about silicidation reaction between the metal layer and the source/drain feature 218. Suitable metal layer may include titanium, tantalum, nickel, cobalt, or tungsten. In embodiments where the metal layer includes nickel and the source/drain feature 218 includes silicon germanium, the silicide layer 262 includes nickel silicide, nickel germanide, and nickel germanosilicide. The silicide layer 262 generally tracks the shape of the exposed source/drain feature 218. Excess portions of the metal layer that does not form the silicide layer 262 may be removed. In embodiments where the self-aligned capping layers 252 and 254 are formed of silicon, corresponding silicide layers may also be formed over exposed surfaces of the self-aligned capping layers 252 and 254. After the formation of the silicide layer 262, the source/drain contact 264 may be formed in the source/drain contact opening 258. The source/drain contact 264 may include aluminum, rhodium, ruthenium, copper, iridium, or tungsten. A planarization process, such as a CMP process, may be followed to remove excess materials and provide a planar surface. For example, the planarization process may be performed to remove excess portions of the metal layer, the silicide layer (e.g., the portion of the silicide layer formed over the self-aligned capping layers 252 and 254), and/or self-aligned capping layers 252 and 254 to define a final shape of the self-aligned capping layers 252 and 254. The source/drain contact 264 is electrically coupled to the source/drain feature 218 by way of the silicide layer 262. In other words, the silicide layer 262 is sandwiched between the source/drain feature 218 and the source/drain contact 264. After the planarization process, the top surface of the self-aligned capping layer 252 spans a width W1 along the X direction. The workpiece 200 has a gate pitch P1 (shown in FIG. 3 and FIG. 19). In some embodiments, a ratio of the width W1 to the gate pitch P1 may be between about 0.3 and about 0.7. If the ratio is greater than 0.7, the source/drain contact opening 258 may have a less satisfactory volume (e.g., a smaller volume compared to that of a workpiece having that ratio ranged between about 0.3 ad about 0.7), thereby disadvantageously affecting gap fill capability. In addition, the source/drain contact 264 formed in the source/drain contact opening 258 may thus have a less satisfactory volume, leading to an increased parasitic resistance. If the ratio is less than about 0.3, the gate trench (filled by the gate stack 242') directly under the self-aligned capping layer 252 may have a dimension that may disadvantageously affect gap fill capability. In an embodiment, the width W1 may be between about 10 nm and about 40 nm. After the planarization process, the self-aligned capping layer 252 has a thickness T1 along the Z direction, the source/drain contact 264 has a thickness T2 along the Z direction. In some embodiments, the thickness T1 may be between about 5 nm and about 30 nm, the thickness T2 may be between about 25 nm and about 50 nm.

Figure 20:
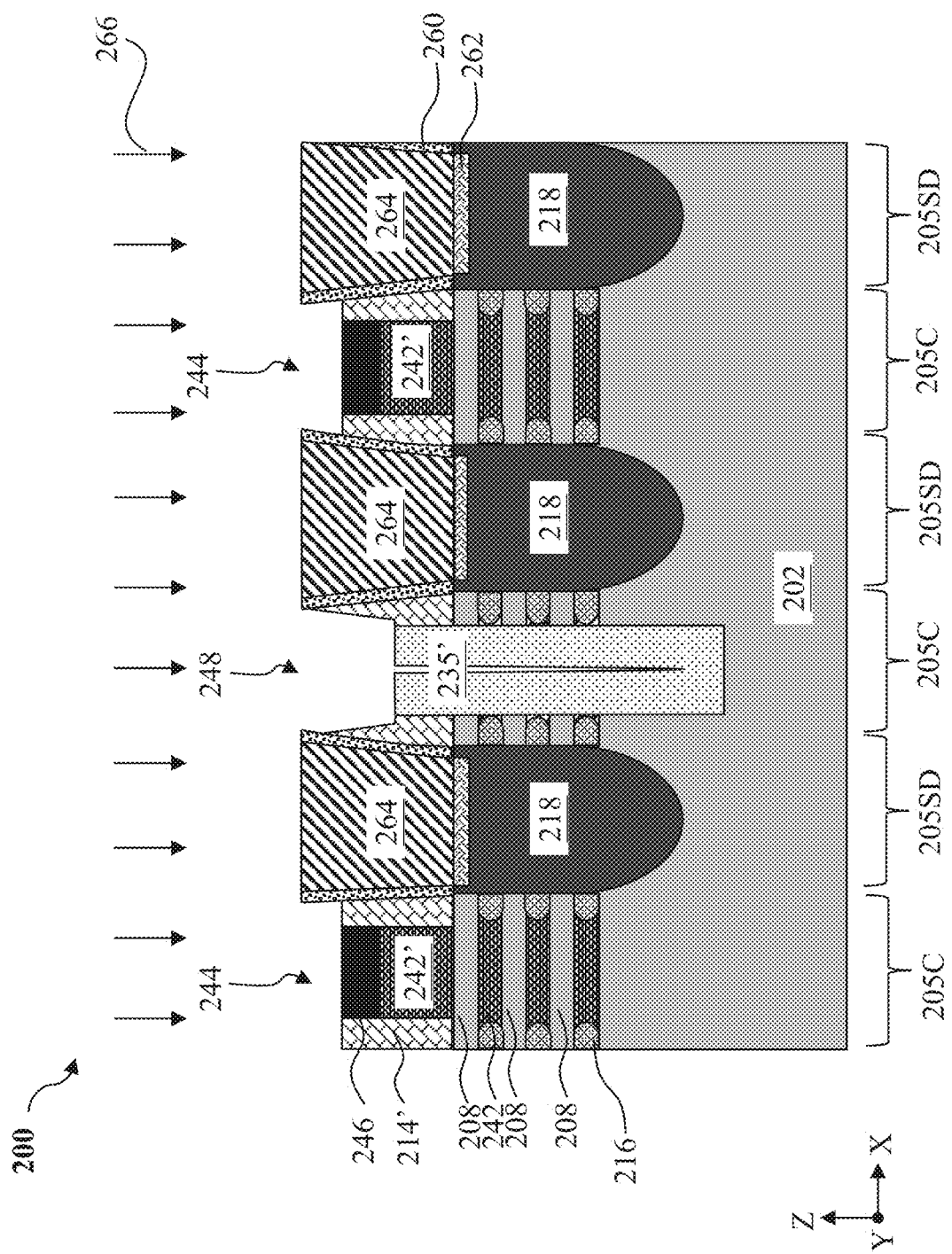
Figure 21:
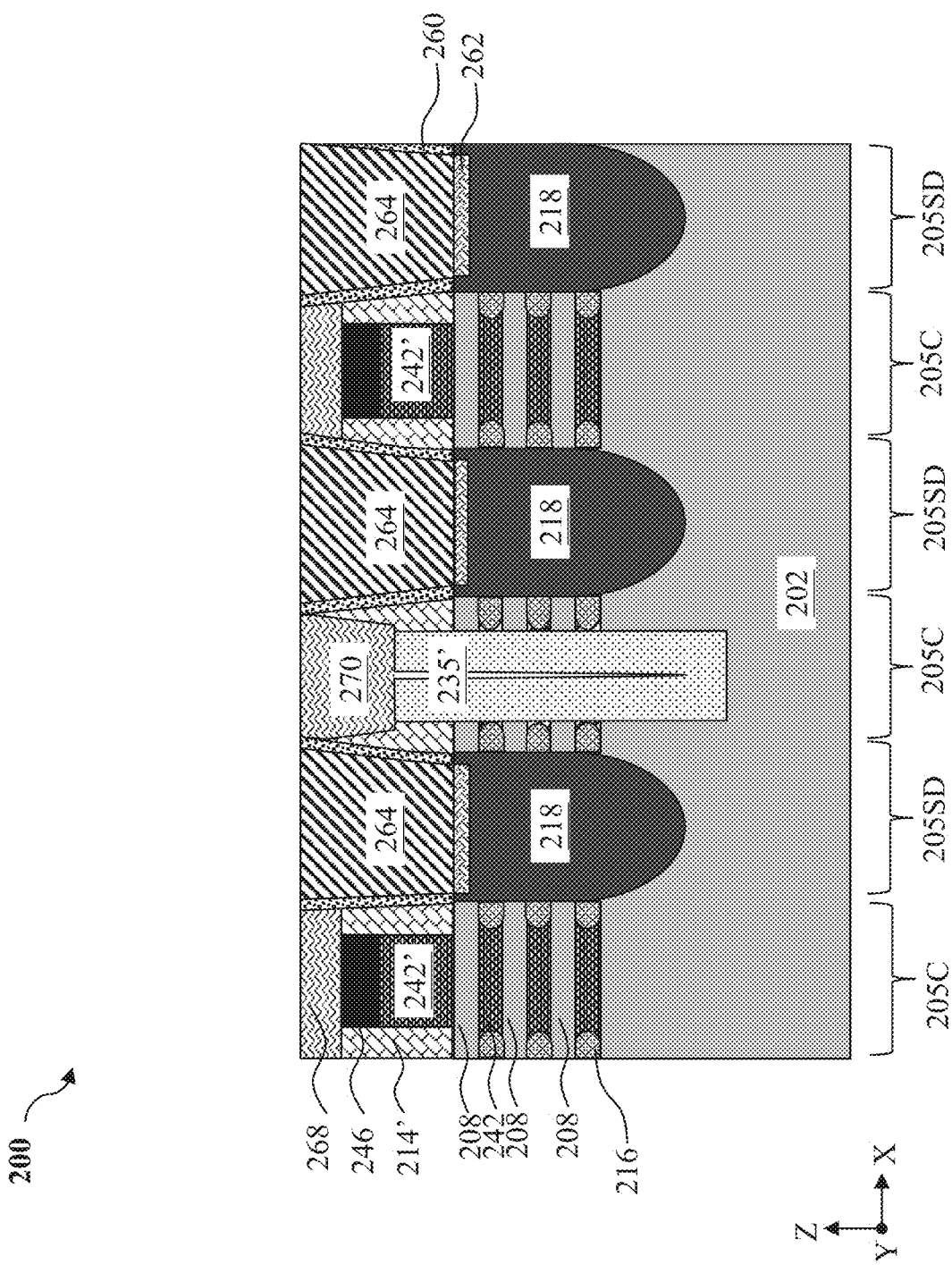

Referring to FIGS. 1 and 20-21, method 100 includes a block 124 where the self-aligned capping layers 252 and 254 are replaced by self-aligned capping layers 268 and 270, respectively. In embodiments where the self-aligned capping layers 252 and 254 are formed of materials (e.g., silicon) that have a relative high dielectric constant, to reduce a parasitic capacitance of the workpiece 200, the silicon-formed self-aligned capping layers 252 and 254 may be replaced by a low-k material. The replacement may include, as shown in FIG. 20, performing an etching process 266 to selectively remove the self-aligned capping layers 252 and 254 without substantially etching the source/drain contacts 264, the metal layer 246 (or the gate stack 242'), the optional barrier layer 260 and the gate spacers 214'. The selective removal of the self-aligned capping layers 252 and 254 releases the recesses 244 and 248, respectively. In some embodiments, the etching process 266 may be a dry etching process or a suitable etching process. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

With reference to FIG. 21, a self-aligned capping layer 268 is then formed in the recess 244 and over the gate stack 242', and a self-aligned capping layer 270 is formed in the recess 248 and over the CPODE structure 235'. In some embodiments, the formation of the self-aligned capping layers 268 and 270 may be in a way similar to the formation of the self-aligned capping layers 252 and 254. For example, a low-k dielectric material may be formed over the workpiece 200 to fill the recesses 244 and 248 by any suitable process (e.g., ALD, FCVD, CVD) and a planarization process may be followed to remove excess portions of the low-k dielectric material (e.g., portions of the low-k dielectric material disposed over the source/drain contact 264). That is, a top surface of the self-aligned capping layer 270 is coplanar with a top surface of the self-aligned capping layer 268 and a top surface of the source/drain contact 264. The low-k dielectric material may include silicon oxycarbide, boron nitride, silicon oxide, other suitable materials, or combinations thereof. In some embodiments, the self-aligned capping layers 268 and 270 may be formed of silicon nitride. The self-aligned capping layers 268 and 270 track the shape of the recesses 244 and 248, respectively. That is, a thickness of the self-aligned capping layer 270 is no less than (i.e., greater than or equal to) a thickness of the self-aligned capping layer 268. By forming the self-aligned capping layer 270 that has a top surface being coplanar with a top surface of the self-aligned capping layer 268 and a top surface of the source/drain contact 264, two adjacent source/drain contacts 264 are electrically isolated by a combination of the self-aligned capping layer 270 and the CPODE structure 235' thereunder, thereby preventing unintentional shorting between two adjacent source/drain contacts 264. By further forming the self-aligned capping layer 270 with a low-k dielectric material, a parasitic capacitance of the workpiece 200 may be advantageously reduced, thereby providing the semiconductor structure 200 improved device performance. It is noted that, in embodiments where the self-aligned capping layers 252 and 254 are formed of low-k dielectric materials such as SiOC, the operations in block 124 may be omitted.

Referring to FIGS. 1 and 21, method 100 includes a block 126 where further processes are performed. Such further processes may include forming a multi-layer interconnect (MLI) structure (not depicted) over the workpiece 200. The MLI may include various interconnect features, such as vias and conductive lines, disposed in dielectric layers, such as etch-stop layers and ILD layers. In some embodiments, the vias are vertical interconnect features configured to interconnect device-level contacts, such as the source/drain contacts 264 formed over the source/drain features 218 and gate contacts (not depicted) formed over the gate stack 242'. In the above embodiments, method 100 is applied to form CPODE structure 235' and the self-aligned capping layers 268 and 270 in GAA transistors. In some other implementations, method 100 may be applied to form CPODE structure and the self-aligned capping layers in FinFETs or planar transistors.

Although not intended to be limiting, one or more embodiments of the present disclosure provide many benefits to a semiconductor structure and the formation thereof. For example, the present disclosure provides an isolation structure, and methods of forming the same, disposed between two device regions and configured to isolate two adjacent source/drain contacts. In the present embodiments, besides offering scaling capability to accommodate fabrication of devices at advanced technology nodes, a combination of the CPODE structure and a self-aligned capping layer formed thereon prevents unintentional damage of the CPODE structure during the formation of source/drain contact openings and allows reduction of the parasitic capacitance of the devices, thereby improving the overall performance of the devices.

The present disclosure provides for many different embodiments. Semiconductor structures and methods of fabrication thereof are disclosed herein. In one exemplary aspect, the present disclosure is directed to a method. The method includes providing a workpiece comprising an active region protruding from a substrate, a first placeholder gate and a second placeholder gate over channel regions of the active region, and a source/drain feature disposed between the channel regions. The method also includes removing a portion of the first placeholder gate and a portion of the substrate thereunder to form an isolation trench, forming a dielectric feature in the isolation trench, replacing the second placeholder gate with a metal gate stack, selectively recessing the dielectric feature, forming a first capping layer directly over the metal gate stack and a second capping layer over the recessed dielectric feature, and forming a source/drain contact over and electrically coupled to the source/drain feature.

In some embodiments, the forming of the dielectric feature may include depositing an oxide dielectric layer over the workpiece and performing a planarization process to the workpiece to form the dielectric feature. After the performing of the planarization process, a top surface of the dielectric feature may be coplanar with a top surface of the second placeholder gate. In some embodiments, the replacing of the second placeholder gate with the metal gate stack may include selectively removing the second placeholder gate to form a gate trench, forming a metal gate structure over the workpiece to fill the gate trench, performing a planarization process to the workpiece to remove a portion of the metal gate structure disposed over a top surface of the dielectric feature, and recessing the metal gate structure in the gate trench to form the metal gate stack. In some embodiments, after the selectively recessing of the dielectric feature, a top surface of the dielectric feature may be coplanar with or lower than a top surface of the metal gate stack. In some embodiments, before the removing of the portion of the first placeholder gate, the workpiece may also include an interlayer dielectric layer disposed over the source/drain feature and between the first placeholder gate and the second placeholder gate, a contact etch stop layer extending along sidewall and bottom surfaces of the interlayer dielectric layer, and a hard mask layer on a top surface of the interlayer dielectric layer. In some embodiments, the forming of the first capping layer and the second capping layer may include depositing a capping material layer over the workpiece and performing a planarization process to the workpiece to remove the hard mask layer and a portion of the capping material layer disposed over the hard mask layer. In some embodiments, the forming of the source/drain contact may include selectively removing the interlayer dielectric layer and the contact etch stop layer without substantially etching the first capping layer and the second capping layer to form a source/drain contact opening, forming a silicide layer, and forming the source/drain contact coupled to the source/drain feature via the silicide layer. In some embodiments, the capping material layer may include Si, BN, or SiOC. In some embodiments, the method may also include, after the forming of the source/drain contact, selectively removing the first capping layer and the second capping layer to form a first cap recess and a second cap recess, respectively, depositing a low-k dielectric layer over the workpiece to fill the first cap recess and the second cap recess, and performing a planarization process to the workpiece to remove a portion of the low-k dielectric layer disposed on a top surface of the source/drain contact.

In another exemplary aspect, the present disclosure is directed to a method. The method includes providing a workpiece comprising a gate structure disposed over a channel region of an active region, a source/drain feature coupled to the channel region, and an isolation feature disposed laterally adjacent to the source/drain feature and having a top surface above a top surface of the gate structure. The method also includes selectively removing an upper portion of the isolation feature until the top surface of the isolation feature is not above the top surface of the gate structure, thereby forming a recessed isolation feature, forming a first capping layer directly over the gate structure and a second capping layer directly over the recessed isolation feature, after the forming of the first capping layer and the second capping layer, forming a source/drain contact over the source/drain feature, and after the forming of the source/drain contact, replacing the first capping layer and the second capping layer with a third capping layer and a fourth capping layer, respectively.

In some embodiments, the workpiece may further include a metal layer disposed on the gate structure and a gate spacer extending along a sidewall surface of the gate structure and a sidewall surface of the metal layer. In some embodiments, the forming of the first capping layer directly over the gate structure and the second capping layer directly over the recessed isolation feature may include depositing a first material layer over the recessed gate structure and the recessed isolation feature and performing a planarization process to the workpiece to form the first capping layer over the gate structure and the second capping layer on the recessed isolation feature. In some embodiments, the replacing of the first capping layer and the second capping layer with the third capping layer and the fourth capping layer may include selectively removing the first capping layer and the second capping layer, depositing a second material layer over the workpiece, and performing a planarization process. In some embodiments, the workpiece may further include an interlayer dielectric layer disposed directly over the source/drain feature. An etch selectivity between the interlayer dielectric layer and the first material layer may be higher than an etch selectivity between the interlayer dielectric layer and the second material layer. In some embodiments, the first material layer may include silicon, the second material layer may include silicon nitride, silicon oxide, silicon oxycarbide, or boron nitride.

In yet another exemplary aspect, the present disclosure is directed to a semiconductor structure. The semiconductor structure includes an active region over a substrate and oriented lengthwise in a first direction, a metal gate stack disposed over a channel region of the active region and oriented lengthwise in a second direction substantially perpendicular to the first direction, source/drain features coupled to the channel region, an isolation structure protruding from the substrate, where the metal gate stack is disposed between the source/drain features, and the isolation structure is oriented lengthwise along the second direction and spaced from the metal gate stack along the first direction. The semiconductor structure also includes a first dielectric capping layer disposed directly over the metal gate stack and a second dielectric capping layer disposed directly over the isolation structure.

In some embodiments, the isolation structure may be formed of an oxide layer. In some embodiments, a top surface of the second dielectric capping layer may be coplanar with a top surface of the first dielectric capping layer, and a thickness of the second dielectric capping layer may be no less than a thickness of the first dielectric capping layer. In some embodiments, a composition of the first dielectric capping layer may be the same as a composition of the second dielectric capping layer. In some embodiments, the semiconductor structure may also include a metal layer disposed between the metal gate stack and the first dielectric capping layer. Along the first direction, a width of the metal layer may be equal to a width of the metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece comprising:
an active region protruding from a substrate,
a first placeholder gate and a second placeholder gate over channel regions of the active region, and
a source/drain feature disposed between the channel regions;
removing a portion of the first placeholder gate and a portion of the substrate thereunder to form an isolation trench;
forming a dielectric feature in the isolation trench, wherein a top surface of the dielectric feature is coplanar with a top surface of the second placeholder gate;
replacing the second placeholder gate with a metal gate stack;
selectively recessing the dielectric feature, thereby forming a recessed dielectric feature;
forming a first capping layer directly over the metal gate stack and a second capping layer over the recessed dielectric feature; and
forming a source/drain contact over and electrically coupled to the source/drain feature.

2. The method of claim 1, wherein the forming of the dielectric feature comprises:
depositing an oxide dielectric layer over the workpiece; and
performing a planarization process to the workpiece to form the dielectric feature.

3. The method of claim 1, wherein the replacing of the second placeholder gate with the metal gate stack comprises:
selectively removing the second placeholder gate to form a gate trench;
forming a metal gate structure over the workpiece to fill the gate trench;
performing a planarization process to the workpiece to remove a portion of the metal gate structure disposed over a top surface of the dielectric feature; and
recessing the metal gate structure in the gate trench to form the metal gate stack.

4. The method of claim 1, wherein, after the selectively recessing of the dielectric feature, a top surface of the dielectric feature is coplanar with or lower than a top surface of the metal gate stack.

5. The method of claim 1, wherein, before the removing of the portion of the first placeholder gate, the workpiece further comprises:
an interlayer dielectric layer disposed over the source/drain feature and between the first placeholder gate and the second placeholder gate;
a contact etch stop layer extending along sidewall and bottom surfaces of the interlayer dielectric layer; and
a hard mask layer on a top surface of the interlayer dielectric layer.

6. The method of claim 5, wherein the forming of the first capping layer and the second capping layer comprises:
depositing a capping material layer over the workpiece; and
performing a planarization process to the workpiece to remove the hard mask layer and a portion of the capping material layer disposed over the hard mask layer.

7. The method of claim 6, wherein the forming of the source/drain contact comprises:
selectively removing the interlayer dielectric layer and the contact etch stop layer without substantially etching the first capping layer and the second capping layer to form a source/drain contact opening;
forming a silicide layer; and
forming the source/drain contact coupled to the source/drain feature via the silicide layer.

8. The method of claim 7, wherein the capping material layer comprises Si, BN, or SiOC.

9. The method of claim 1, further comprising:
after the forming of the source/drain contact, selectively removing the first capping layer and the second capping layer to form a first cap recess and a second cap recess, respectively;
depositing a low-k dielectric layer over the workpiece to fill the first cap recess and the second cap recess; and
performing a planarization process to the workpiece to remove a portion of the low-k dielectric layer disposed on a top surface of the source/drain contact.

10. A method, comprising:
providing a workpiece comprising:
a gate structure disposed over a channel region of an active region,
a source/drain feature coupled to the channel region, and
an isolation feature disposed laterally adjacent to the source/drain feature and having a top surface below a top surface of the gate structure;
simultaneously forming a first capping layer directly over the gate structure and a second capping layer directly over the isolation feature;
after the forming of the first capping layer and the second capping layer, forming a source/drain contact over the source/drain feature; and
after the forming of the source/drain contact, replacing the first capping layer and the second capping layer with a third capping layer and a fourth capping layer, respectively.

11. The method of claim 10, wherein the workpiece further comprises:
a metal layer disposed on the gate structure; and
a gate spacer extending along a sidewall surface of the gate structure and a sidewall surface of the metal layer.

12. The method of claim 10, wherein the forming of the first capping layer directly over the gate structure and the second capping layer directly over the isolation feature comprises:
depositing a first material layer over the gate structure and the isolation feature; and
performing a planarization process to the workpiece to form the first capping layer over the gate structure and the second capping layer on the isolation feature.

13. The method of claim 12, wherein the replacing of the first capping layer and the second capping layer with the third capping layer and the fourth capping layer comprises:
selectively removing the first capping layer and the second capping layer;
depositing a second material layer over the workpiece; and
performing a planarization process.

14. The method of claim 13, wherein the workpiece further comprises:
an interlayer dielectric layer disposed directly over the source/drain feature,
wherein an etch selectivity between the interlayer dielectric layer and the first material layer is higher than an etch selectivity between the interlayer dielectric layer and the second material layer.

15. The method of claim 13, wherein the first material layer comprises silicon, the second material layer comprises silicon nitride, silicon oxide, silicon oxycarbide, or boron nitride.

16. A method, comprising:
forming an active region over a substrate, the active region comprising a channel region and a source/drain feature coupled to the channel region;
forming a trench extending through the channel region and extending into the substrate;
forming a dielectric feature in a lower portion of the trench;
forming a sacrificial feature on the dielectric feature and in an upper portion of the trench;
after the forming of the sacrificial feature, forming a source/drain contact over and electrically coupled to the source/drain feature; and
after the forming of the source/drain contact, replacing the sacrificial feature with a dielectric layer.

17. The method of claim 16, wherein the sacrificial feature is formed of silicon.

18. The method of claim 16, wherein the source/drain feature is separated from the dielectric feature by inner spacer features.

19. The method of claim 16, wherein the channel region is a first channel region, the active region further comprises a second channel region coupled to the source/drain feature, and the method further comprises:
forming a dummy gate structure over the second channel region; and
before the forming of the sacrificial feature on the dielectric feature, replacing the dummy gate structure with a functional gate structure.

20. The method of claim 19, wherein the dielectric layer is further formed directly over the functional gate structure.

* * * * *